US012810939B2

(12) United States Patent
Shin et al.

(10) Patent No.: US 12,810,939 B2
(45) Date of Patent: Nov. 24, 2026

(54) METHOD OF PROGRAMMING DATA IN NONVOLATILE MEMORY DEVICE AND NONVOLATILE MEMORY DEVICE PERFORMING THE SAME

(71) Applicant: SAMSUNG ELECTRONICS CO., LTD., Suwon-si (KR)

(72) Inventors: Woosul Shin, Suwon-si (KR); Sungwon Yun, Suwon-si (KR); Hyunkook Park, Suwon-si (KR); Hyunjun Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 18/602,636

(22) Filed: Mar. 12, 2024

(65) Prior Publication Data

US 2024/0379164 A1 Nov. 14, 2024

(30) Foreign Application Priority Data

May 9, 2023 (KR) ........................ 10-2023-0059736
Jul. 25, 2023 (KR) ........................ 10-2023-0096595

(51) Int. Cl.
*G11C 16/10* (2006.01)
*G11C 16/08* (2006.01)
*G11C 16/34* (2006.01)

(52) U.S. Cl.
CPC ............ *G11C 16/102* (2013.01); *G11C 16/08* (2013.01); *G11C 16/3459* (2013.01)

(58) Field of Classification Search
None
See application file for complete search history.

(56) References Cited

U.S. PATENT DOCUMENTS

| | | | | |
|---|---|---|---|---|
| 8,310,870 | B2 | 11/2012 | Dutta et al. | |
| 9,202,587 | B2 | 12/2015 | Jo et al. | |
| 9,349,482 | B2 | 5/2016 | Kim et al. | |
| 11,507,448 | B2 | 11/2022 | Kim et al. | |
| 2015/0049545 | A1 * | 2/2015 | Jo | G11C 16/3459 365/185.03 |
| 2015/0199267 | A1 | 7/2015 | Oh et al. | |
| 2020/0319953 | A1 * | 10/2020 | Kim | G06F 13/1673 |

FOREIGN PATENT DOCUMENTS

| | | | |
|---|---|---|---|
| KR | 10-0739251 | B1 | 7/2007 |
| KR | 10-2014-0079912 | A | 6/2014 |
| KR | 10-2015-0085375 | A | 7/2015 |

* cited by examiner

*Primary Examiner* — Alfredo Bermudez Lozada
(74) *Attorney, Agent, or Firm* — Sughrue Mion, PLLC

(57) ABSTRACT

A method of programming data in a nonvolatile memory device includes setting a state ordering to a first state ordering, the state ordering representing a relationship between a plurality of states and data values of multi-bit data, performing, based on the first state ordering, a program operation on target memory cells of the plurality of memory cells, swapping the state ordering from the first state ordering to a second state ordering different from the first state ordering, performing, based on the second state ordering, the program operation on the target memory cells, re-swapping the state ordering from the second state ordering to the first state ordering, and performing, based on the first state ordering, the program operation on the target memory cells. Each memory cell of a plurality of memory cells of the nonvolatile memory device is programmed to have one of the plurality of states.

20 Claims, 32 Drawing Sheets

BLKi

531

| | E | P1t | P2t | P3t | P4t | P5t | P6t | P7t |
|---|---|---|---|---|---|---|---|---|
| S_ORD_1a: | 0 | 0 | 0 | 0 | 1 | 1 | 1 | 1 |
| | 0 | 0 | 1 | 1 | 0 | 0 | 1 | 1 |
| | 0 | 1 | 0 | 1 | 0 | 1 | 0 | 1 |
| S_ORD_2a: | 0 | 1 | 0 | 0 | 0 | 1 | 1 | 1 |
| | 0 | 0 | 1 | 1 | 0 | 0 | 1 | 1 |
| | 0 | 0 | 0 | 1 | 1 | 1 | 0 | 1 |

| State | S_ORD_1b: | S_ORD_2b: | S_ORD_3b: |
|---|---|---|---|
| E | 0 0 0 0 | 0 0 0 0 | 0 0 0 0 |
| P1q | 0 0 0 1 | 0 0 0 1 | 0 0 0 1 |
| P2q | 0 0 1 0 | 0 0 1 0 | 0 0 1 0 |
| P3q | 0 0 1 1 | 1 0 0 1 | 1 0 0 1 |
| P4q | 0 1 0 0 | 0 1 0 0 | 0 1 0 0 |
| P5q | 0 1 0 1 | 0 1 0 1 | 1 0 0 0 |
| P6q | 0 1 1 0 | 0 1 1 0 | 0 1 1 0 |
| P7q | 0 1 1 1 | 0 1 1 1 | 0 1 1 1 |
| P8q | 1 0 0 0 | 1 0 0 0 | 0 1 0 1 |
| P9q | 1 0 0 1 | 0 0 1 1 | 0 0 1 1 |
| P10q | 1 0 1 0 | 1 0 1 0 | 1 0 1 0 |
| P11q | 1 0 1 1 | 1 0 1 1 | 1 0 1 1 |
| P12q | 1 1 0 0 | 1 1 0 0 | 1 1 0 0 |
| P13q | 1 1 0 1 | 1 1 0 1 | 1 1 0 1 |
| P14q | 1 1 1 0 | 1 1 1 0 | 1 1 1 0 |
| P15q | 1 1 1 1 | 1 1 1 1 | 1 1 1 1 |

S_ORD_3b:

| E | P1q | P2q | P3q | P4q | P5q | P6q | P7q | P8q | P9q | P10q | P11q | P12q | P13q | P14q | P15q |
|---|---|---|---|---|---|---|---|---|---|---|---|---|---|---|---|
| 0 | 0 | 0 | 1 | 0 | 1 | 0 | 0 | 0 | 0 | 1 | 1 | 1 | 1 | 1 | 1 |
| 0 | 0 | 0 | 0 | 1 | 0 | 1 | 1 | 1 | 0 | 0 | 0 | 1 | 1 | 1 | 1 |
| 0 | 0 | 1 | 0 | 0 | 0 | 1 | 1 | 0 | 1 | 1 | 1 | 0 | 0 | 1 | 1 |
| 0 | 1 | 0 | 1 | 0 | 0 | 0 | 1 | 1 | 1 | 0 | 1 | 0 | 1 | 0 | 1 |

S_ORD_2b:

| E | P1q | P2q | P3q | P4q | P5q | P6q | P7q | P8q | P9q | P10q | P11q | P12q | P13q | P14q | P15q |
|---|---|---|---|---|---|---|---|---|---|---|---|---|---|---|---|
| 0 | 0 | 0 | 1 | 0 | 0 | 0 | 0 | 1 | 0 | 1 | 1 | 1 | 1 | 1 | 1 |
| 0 | 0 | 0 | 0 | 1 | 1 | 1 | 1 | 0 | 0 | 0 | 0 | 1 | 1 | 1 | 1 |
| 0 | 0 | 1 | 0 | 0 | 0 | 1 | 1 | 0 | 1 | 1 | 1 | 0 | 0 | 1 | 1 |
| 0 | 1 | 0 | 1 | 0 | 1 | 0 | 1 | 0 | 1 | 0 | 1 | 0 | 1 | 0 | 1 |

S_ORD_1b:

| E | P1q | P2q | P3q | P4q | P5q | P6q | P7q | P8q | P9q | P10q | P11q | P12q | P13q | P14q | P15q |
|---|---|---|---|---|---|---|---|---|---|---|---|---|---|---|---|
| 0 | 0 | 0 | 0 | 0 | 0 | 0 | 0 | 1 | 1 | 1 | 1 | 1 | 1 | 1 | 1 |
| 0 | 0 | 0 | 0 | 1 | 1 | 1 | 1 | 0 | 0 | 0 | 0 | 1 | 1 | 1 | 1 |
| 0 | 0 | 1 | 1 | 0 | 0 | 1 | 1 | 0 | 0 | 1 | 1 | 0 | 0 | 1 | 1 |
| 0 | 1 | 0 | 1 | 0 | 1 | 0 | 1 | 0 | 1 | 0 | 1 | 0 | 1 | 0 | 1 |

METHOD OF PROGRAMMING DATA IN NONVOLATILE MEMORY DEVICE AND NONVOLATILE MEMORY DEVICE PERFORMING THE SAME

CROSS-REFERENCE TO RELATED APPLICATIONS

This application claims benefit of priority under 35 U.S.C. § 119 to Korean Patent Application No. 10-2023-0059736, filed on May 9, 2023, and to Korean Patent Application No. 10-2023-0096595, filed on Jul. 25, 2023, in the Korean Intellectual Property Office, the disclosures of which are incorporated by reference herein in their entireties.

BACKGROUND

1. Technical Field

The present disclosure relates generally to semiconductor integrated circuits, and more particularly, to methods of programming data in nonvolatile memory devices, and nonvolatile memory devices performing the methods of programming data.

2. Description of the Related Art

Semiconductor memory devices may include volatile and nonvolatile memory devices. Volatile memory devices may refer to devices that may lose stored data when disconnected from power, and nonvolatile memory devices may refer to devices that may retain stored data when disconnected from power. Volatile memory devices may typically perform read and write operations at a higher speed than nonvolatile memory devices. Nonvolatile memory devices may be used to store data that may need to be retained regardless of whether power is provided.

In nonvolatile memory devices, a plurality of program loops may be executed to store a plurality of data bits in a memory cell, and a verification operation may be performed with respect to each program state every program loop. Thus, there exists a need to shorten a program verification time in order to potentially reduce a program time.

SUMMARY

One or more example embodiments of the present disclosure provide a method of programming data in a nonvolatile memory device capable of potentially reducing a program time when compared to related nonvolatile memory devices.

Further, one or more example embodiments of the present disclosure provide a nonvolatile memory device capable of performing the method of programming data.

According to an aspect of the present disclosure, a method of programming data in a nonvolatile memory device, the method includes setting a state ordering to a first state ordering, the state ordering representing a relationship between a plurality of states and data values of multi-bit data, performing, based on the first state ordering, a program operation on target memory cells of the plurality of memory cells, swapping the state ordering from the first state ordering to a second state ordering different from the first state ordering, performing, based on the second state ordering, the program operation on the target memory cells, re-swapping the state ordering from the second state ordering to the first state ordering, and performing, based on the first state ordering, the program operation on the target memory cells. Each memory cell of a plurality of memory cells of the nonvolatile memory device is programmed to have one of the plurality of states.

According to an aspect of the present disclosure, a nonvolatile memory device includes a memory cell array including a plurality of memory cells in which each memory cell of the plurality of memory cells being programmed to have one of a plurality of states, a page buffer circuit configured to control the plurality of memory cells, the page buffer circuit including a plurality of page buffers configured to set a state ordering based on state data, the state ordering representing a relationship between the plurality of states and data values of multi-bit data, and a control circuit configured to set the state ordering to a first state ordering, perform a program operation on target memory cells based on the first state ordering, swap the state ordering from the first state ordering to a second state ordering different from the first state ordering, perform the program operation on the target memory cells based on the second state ordering, re-swap the state ordering from the second state ordering to the first state ordering, and perform the program operation on the target memory cells based on the first state ordering.

According to an aspect of the present disclosure, a method of programming data in a nonvolatile memory device includes setting a state ordering to a first state ordering, the state ordering representing a relationship between a plurality of states and data values of multi-bit data, performing, based on the first state ordering, a program operation on target memory cells of the plurality of memory cells, swapping, based on the program operation being performed with respect to a first state from among the plurality of states, the state ordering from the first state ordering to a second state ordering different from the first state ordering, performing, based on the second state ordering, the program operation on the target memory cells, re-swapping, based on the program operation being performed with respect to a second state from among the plurality of states that is different from the first state, the state ordering from the second state ordering to the first state ordering, and performing, based on the first state ordering, the program operation on the target memory cells. Each memory cell of a plurality of memory cells of the nonvolatile memory device is programmed to have one of the plurality of states. In the first state ordering, the first state corresponds to a first data value, and the second state corresponds to a second data value different from the first data value. In the second state ordering, the first state corresponds to the second data value, and the second state corresponds to the first data value. The program operation includes a plurality of program loops. The plurality of program loops includes a first program loop to an N-th program loop, where N is a positive integer greater than or equal to two. The swapping of the state ordering from the first state ordering to the second state ordering is performed during the first program loop. The re-swapping of the state ordering from the second state ordering to the first state ordering is performed during a K-th program loop subsequent to the first program loop, where K is a positive greater than or equal to two and less than or equal to N. The first state ordering and the second state ordering are determined such that a second total time required for the program operation based on the second state ordering is shorter than a first total time required for the program operation based on the first state ordering.

In the method of programming data in the nonvolatile memory device and the nonvolatile memory device according to example embodiments, the state ordering may be controlled, adjusted, swapped, and/or changed during the program operation, and thus the program speed may be increased and/or improved, and/or the program time may be reduced and/or shortened. For example, the program operation may be performed by changing to the optimized state ordering, and then the program operation may be performed by changing back to the default state ordering after a predetermined time has elapsed. As another example, the state ordering may be swapped from the default state ordering to the optimized state ordering, and as a result, a data transfer with a relatively long time may be prevented from occurring in a specific time interval. Consequently, the time required for the program operation may be shortened. Accordingly, the program operation may be efficiently performed when compared to related nonvolatile memory devices.

Additional aspects may be set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure may be more apparent from the following description taken in conjunction with the accompanying drawings, in which.

DETAILED DESCRIPTION

Figure 1:
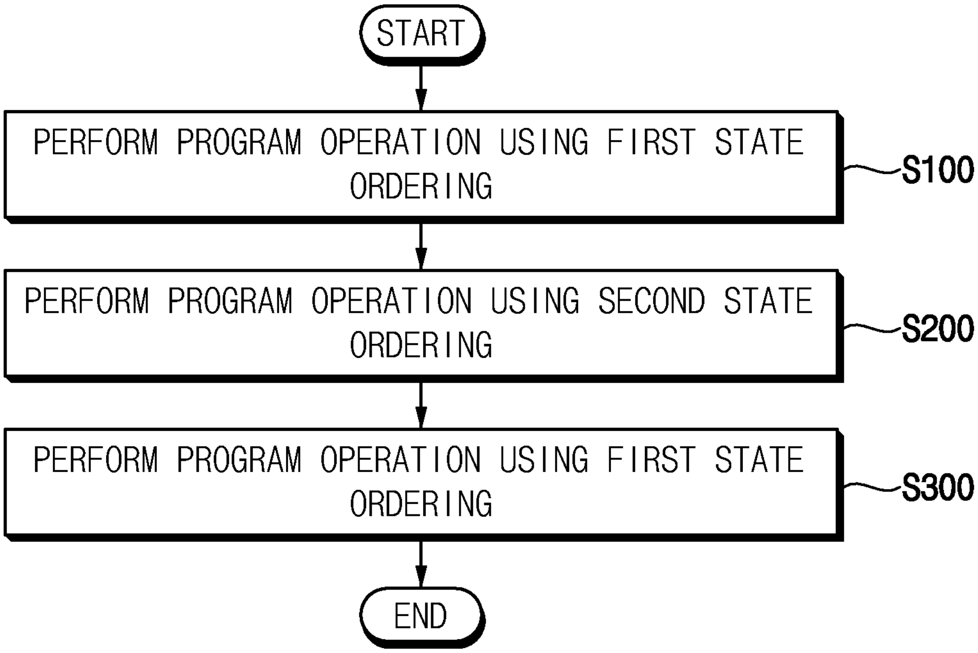
FIG. 1 is a flowchart illustrating a method of programming data in a nonvolatile memory device, according to example embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, controller, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like. Hereinafter, various embodiments of the present disclosure are described with reference to the accompanying drawings.

FIG. 1 is a flowchart illustrating a method of programming data in a nonvolatile memory device, according to example embodiments.

Referring to FIG. 1, a method of programming data, according to example embodiments, is performed by a nonvolatile memory device that includes a plurality of memory cells. Each of the plurality of memory cells is programmed to have one of a plurality of states. A configuration of the nonvolatile memory device is described with reference to FIGS. 3, 4, 5, 6A, and 6B.

As shown in FIG. 1, in the method of programming data in the nonvolatile memory device according to example embodiments, a program operation is performed using a first state ordering (operation S100). A state ordering may represent and/or indicate a relationship and/or correspondence between the plurality of states and a plurality of data values. The plurality of data values may be data values of multi-bit data having two or more bits, and may be different from each other. For example, the state ordering may be an operation of matching each of the plurality of data values of the multi-bit data to a respective state of the plurality of states. As another example, each of the plurality of states may represent a state in which a memory cell may be programmed during a program operation for the multi-bit data. As used herein, the first state ordering may be referred to as a default state ordering.

The program operation may be performed using a second state ordering that is different from the first state ordering (operation S200). For example, as compared to the relationship between the plurality of states and the plurality of data values in the first state ordering, some or all of the relationships between the plurality of states and the plurality of data values may be changed in the second state ordering. For example, an operation of swapping and/or changing the state ordering may be performed in operation S200. As used herein, the second state ordering may be referred to as a swapped (or changed) state ordering and/or an optimized state ordering.

The program operation may be performed using the first state ordering (operation S300). For example, an operation of re-swapping and/or changing back (or returning) the state ordering to the first state ordering may be performed in operation S300.

In the method of programming data in the nonvolatile memory device, according to example embodiments, the state ordering may be controlled, adjusted, swapped, and/or changed during the program operation, and thus the program speed may be increased and/or improved, and/or the program time may be reduced or shortened. For example, the program operation may be performed by changing to the optimized state ordering, and then the program operation may be performed by changing back to the default state ordering after a predetermined time has elapsed. Accordingly, the program time may be potentially reduced when compared to related nonvolatile memory devices.

Figure 2:
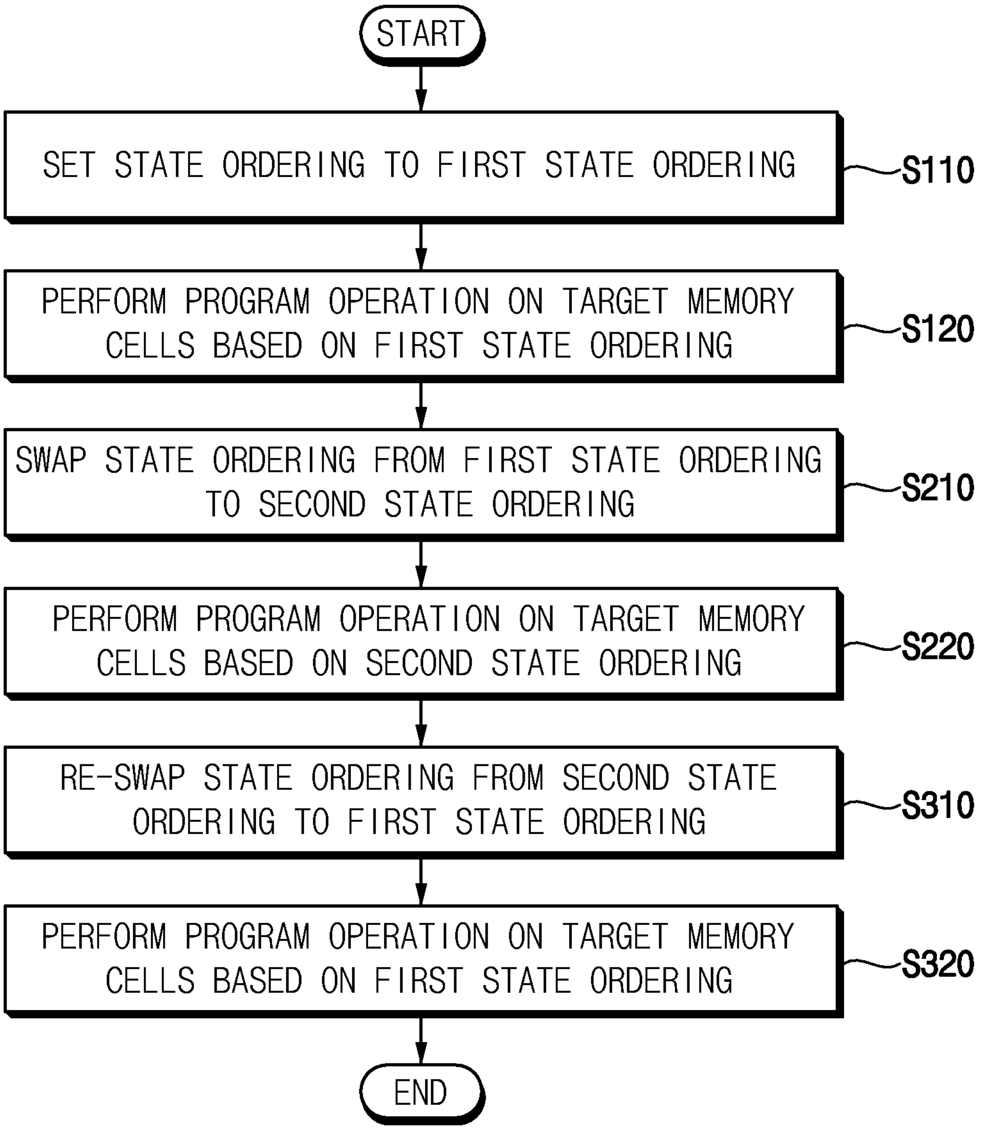
FIG. 2 is a flowchart illustrating an example of a method of programming data in a nonvolatile memory device of FIG. 1, according to example embodiments.

FIG. 2 is a flowchart illustrating an example of a method of programming data in a nonvolatile memory device of FIG. 1, according to example embodiments.

Referring to operation S100 of FIG. 1, the performing of the program operation using the first state ordering may include setting the state ordering to the first state ordering (operation S110), and the program operation may be performed on target memory cells from among the plurality of memory cells based on the first state ordering (operation S120).

Referring to operation S200 of FIG. 1, the performing of the program operation using the second state ordering may include swapping the state ordering from the first state ordering to the second state ordering (operation S210), and the program operation may be performed on the target memory cells based on the second state ordering (operation S220).

Referring to operation S300 of FIG. 1, the performing of the program operation using the first state ordering may include re-swapping the state ordering from the second state ordering to the first state ordering (operation S310), and the program operation may be performed on the target memory cells based on the first state ordering (operation S320).

In some example embodiments, operations S100, S200, and S300 of FIG. 1 (e.g., operations S110, S120, S210, S220, S310, and S320 of FIG. 2) may be performed during a single programming procedure for the target memory cells. For example, as described with reference to FIGS. 7 and 13A, while the programming procedure for the target memory cells is performed, a plurality of program loops may be sequentially performed, and operations S200 and S300 may be performed in different program loops.

In some example embodiments, as described with reference to FIGS. 3, 6A, and 6B, the nonvolatile memory device may include a plurality of page buffers. Each page buffer of the plurality of page buffers may include a plurality of latches. The state ordering may be set and/or changed based on state data stored in the plurality of latches. For example, in operations S110 and S310, the state ordering may be set and/or re-swapped to the first state ordering based on first state data stored in the plurality of latches. As another example, in operation S210, the state ordering may be swapped to the second state ordering based on second state data stored in the plurality of latches.

Figure 3:
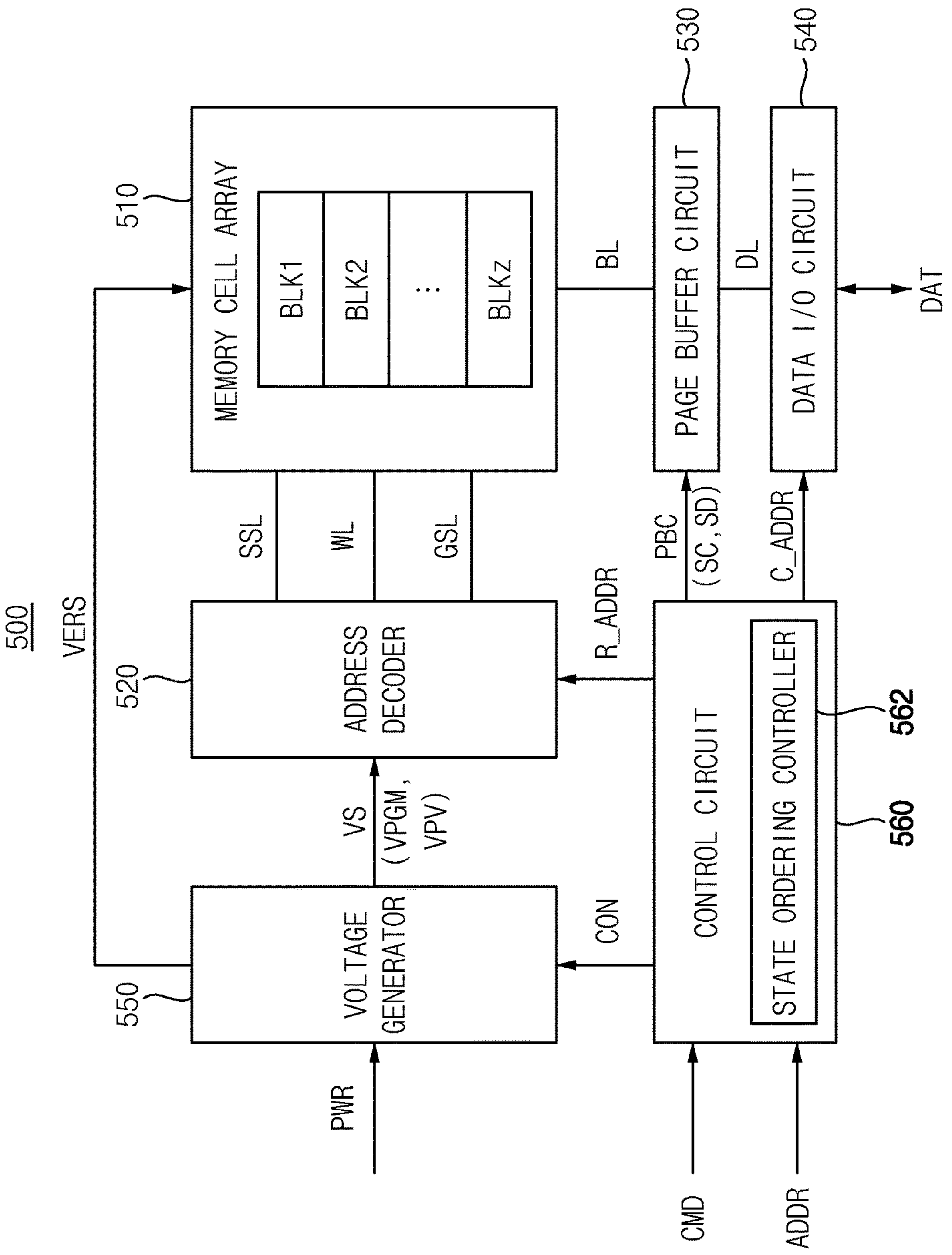
FIG. 3 is a block diagram illustrating a nonvolatile memory device, according to example embodiments.

FIG. 3 is a block diagram illustrating a nonvolatile memory device, according to example embodiments.

Referring to FIG. 3, a nonvolatile memory device 500 may include a memory cell array 510, a page buffer circuit 530, and a control circuit 560. The nonvolatile memory device 500 may further include an address decoder 520, a data input/output (I/O) circuit 540, and a voltage generator 550.

The memory cell array 510 may be connected (e.g., communicatively coupled) to the address decoder 520 via a plurality of string selection lines SSL, a plurality of wordlines WL, and a plurality of ground selection lines GSL. The memory cell array 510 may be further connected (e.g., communicatively coupled) to the page buffer circuit 530 via a plurality of bitlines BL. The memory cell array 510 may include a plurality of memory cells (e.g., a plurality of nonvolatile memory cells) that may be connected to the plurality of wordlines WL and the plurality of bitlines BL. The memory cell array 510 may be divided into a plurality of memory blocks (e.g., first memory block BLK1, second memory block BLK2, to z-th memory block BLKz, where z is a positive integer greater than zero (0), hereinafter generally referred to as "BLK"). Each memory block of the plurality of memory blocks BLK may include one or more memory cells. In some embodiments, each memory block of the plurality of memory blocks BLK may be divided into a plurality of pages.

In some example embodiments, as described with reference to FIGS. 4 and 5, the memory cell array 510 may be and/or may include a three-dimensional (3D) memory cell array, which may be formed on a substrate in a 3D structure (or a vertical structure). In such embodiments, the memory cell array 510 may include a plurality of cell strings (e.g., a plurality of vertical NAND strings) that may be vertically oriented such that at least one memory cell is located over another memory cell.

The control circuit 560 may receive a command CMD and an address ADDR from outside the nonvolatile memory device 500 (e.g., from a memory controller 20 in FIG. 22), and may control an erasing procedure, a programming procedure, and/or a read operation of the nonvolatile memory device 500 based on the command CMD and the address ADDR. As used herein, an erasure procedure may include performing a sequence of one or more erase loops, and a programming procedure may include performing a sequence of one or more program loops. Each erase loop may include an erase execution operation and an erase verification operation. Each program loop may include a program execution operation and a program verification operation. The read operation may include a normal read operation and a data recovery read operation.

The control circuit 560 may generate control signals CON, which may be used for controlling the voltage generator 550, and may generate control signals PBC for controlling the page buffer circuit 530, based on the command CMD, and may generate a row address R_ADDR and a column address C_ADDR based on the address ADDR. The control signals PBC may include a state ordering control signal SC and state data SD. The control circuit 560 may provide the row address R_ADDR to the address decoder 520 and may provide the column address C_ADDR to the data I/O circuit 540.

The control circuit 560 may control the address decoder 520, the page buffer circuit 530, the data I/O circuit 540 and the voltage generator 550 such that the nonvolatile memory device 500 may perform the method of programming data according to example embodiments described with reference to FIGS. 1 and 2. For example, the control circuit 560 may control the nonvolatile memory device 500 to swap and/or re-swap the state ordering during the program operation, and may control the nonvolatile memory device 500 to perform the program operation by changing to the optimized state ordering and then returning back to the default state ordering after a predetermined time has elapsed.

The control circuit 560 may include a state ordering controller 562 that may control the state ordering. Alternatively or additionally, the control circuit 560 may control the address decoder 520, the page buffer circuit 530, the data I/O circuit 540, and the voltage generator 550, such that the nonvolatile memory device 500 may perform methods of programming data according to example embodiments, as described with reference to FIGS. 17, 18, and 19.

The address decoder 520 may be connected (e.g., communicatively coupled) to the memory cell array 510 via the plurality of string selection lines SSL, the plurality of wordlines WL, and the plurality of ground selection lines GSL. For example, in the data operations (e.g., erase, program, read operations), the address decoder 520 may determine at least one of the plurality of wordlines WL as a selected wordline, may determine at least one of the plurality of string selection lines SSL as a selected string selection line, and may determine at least one of the plurality of ground selection lines GSL as a selected ground selection line, based on the row address R_ADDR.

The voltage generator 550 may generate voltages VS that may be needed for an operation of the nonvolatile memory device 500 based on a power PWR and the control signals CON. The voltages VS may be applied to the plurality of string selection lines SSL, the plurality of wordlines WL, and the plurality of ground selection lines GSL via the address decoder 520. For example, the voltages VS may include a program voltage VPGM and a program verification voltage VPV that may be needed for the program loop, and the like. In addition, the voltage generator 550 may generate an erase voltage VERS that may be needed for the data erase operation based on the power PWR and the control signals CON. The erase voltage VERS may be applied to the memory cell array 510 directly and/or via the bitline BL.

For example, during the program execution operation, the voltage generator 550 may apply the program voltage VPGM to the selected wordline and may apply a program pass voltage to unselected wordlines via the address decoder 520. As another example, during the program verification operation, the voltage generator 550 may apply the program verification voltage VPV to the selected wordline and may apply a verification pass voltage to the unselected wordlines via the address decoder 520.

The page buffer circuit 530 may be connected (e.g., communicatively coupled) to the memory cell array 510 via the plurality of bitlines BL. The page buffer circuit 530 may include a plurality of page buffers (e.g., first page buffer PB1, second page buffer PB2, third page buffer PB3, to x-th page buffer PBx in FIG. 6A). The page buffer circuit 530 may store data DAT to be programmed into the memory cell array 510 and/or may read data DAT sensed from the memory cell array 510. That is, the page buffer circuit 530 may operate as a write driver and/or a sensing amplifier according to an operation mode of the nonvolatile memory device 500.

The page buffer circuit 530 may set and/or change the state ordering based on the state ordering control signal SC and the state data SD. For example, during the program operation, the program operation may be performed by changing from the default state ordering to the optimized state ordering, and then the program operation may be performed by returning back to the default state ordering after a predetermined time has elapsed. As another example, during the read operation, the read operation may be performed based on the default state ordering.

The data I/O circuit 540 may be connected (e.g., communicatively coupled) to the page buffer circuit 530 via data lines DL. The data I/O circuit 540 may provide the data DAT from outside of the nonvolatile memory device 500 (e.g., from the memory controller 20 in FIG. 22) to the memory cell array 510 via the page buffer circuit 530 and/or may provide the data DAT from the memory cell array 510 to the outside of the nonvolatile memory device 500 (e.g., to the memory controller 20 in FIG. 22), based on the column address C_ADDR.

Figure 4:
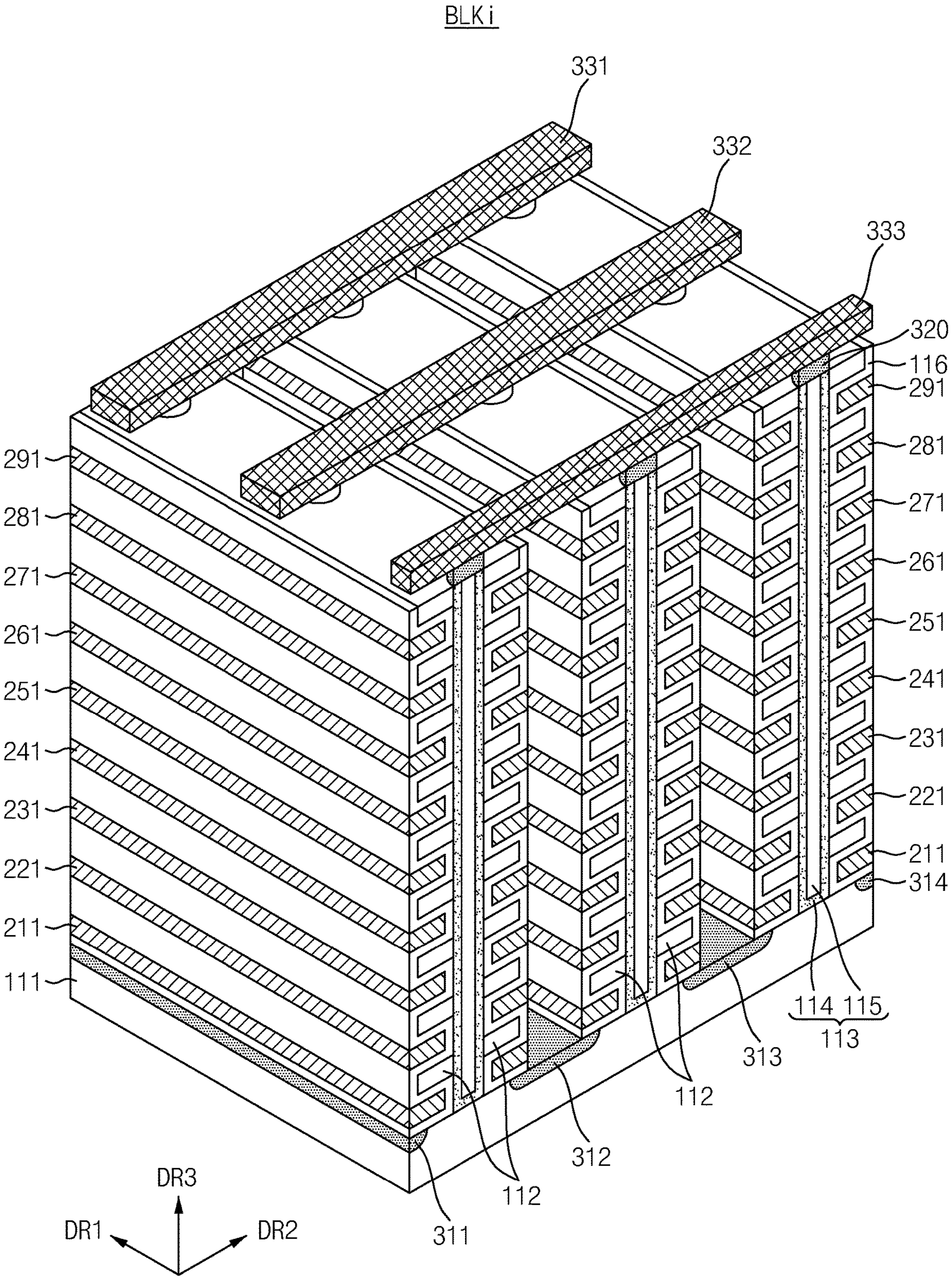
FIG. 4 is a perspective view of an example of a memory block included in a memory cell array in a nonvolatile memory device of FIG. 3, according to example embodiments.

FIG. 4 is a perspective view of an example of a memory block included in a memory cell array in a nonvolatile memory device of FIG. 3, according to example embodiments.

Referring to FIG. 4, a memory block BLKi may include a plurality of cell strings (e.g., a plurality of vertical NAND strings) which may be formed on a substrate in a 3D structure (or a vertical structure). The memory block BLKi may include structures extending along a first direction DR1, a second direction DR2, and/or a third direction DR3. Two directions may be substantially parallel to a first surface (e.g., a top surface) of a substrate 111 and may cross each other, and may be respectively referred to as the first direction DR1 (e.g., a X-axis direction) and the second direction DR2 (e.g., a Y-axis direction). In addition, a direction substantially vertical to the first surface of the substrate 111 may be referred to as the third direction DR3 (e.g., a Z-axis direction). For example, the first and second directions DR1 and DR2 may be substantially perpendicular to each other. In addition, the third direction DR3 may be substantially perpendicular to both the first and second directions DR1 and DR2.

The substrate 111 may be provided. The substrate 111 may have a well of a first type of charge carrier impurity (e.g., a first conductivity type) therein. For example, the substrate 111 may have a p-well formed by implanting a group III element such as, but not limited to, boron (B). As another example, the substrate 111 may have a pocket p-well provided within an n-well. In an embodiment, the substrate 111 may have a p-type well (or a p-type pocket well). However, the conductive type of the substrate 111 is not limited to p-type.

A plurality of doping regions (e.g., first doping region 311, second doping region 312, third doping region 313, and fourth doping region 314) that may be arranged along the second direction DR2 may be provided in and/or on the substrate 111. The plurality of doping regions 311 to 314 may have a second type of charge carrier impurity (e.g., a second conductivity type) different from the first type of the substrate 111. In an embodiment, the first to fourth doping regions 311 to 314 may be an n-type. However, the conductive type of the first to fourth doping regions 311 to 314 is not limited to n-type.

A plurality of insulation materials 112 extending along the first direction DR1 may be sequentially provided along the third direction DR3 on a region of the substrate 111 between the first and second doping regions 311 and 312. For example, the plurality of insulation materials 112 may be provided along the third direction DR3, being spaced by a specific distance. The insulation materials 112 may include an insulation material such as, but not limited to, an oxide layer.

A plurality of pillars 113 penetrating the insulation materials along the third direction DR3 may be sequentially disposed along the first direction DR1 on a region of the substrate 111 between the first and second doping regions 311 and 312. For example, the plurality of pillars 113 may at least partially penetrate the insulation materials 112 to contact the substrate 111.

In some example embodiments, each pillar of the plurality of pillars 113 may include a plurality of materials. For example, a channel layer 114 of each pillar 113 may include a silicon material having a first conductivity type. As another example, the channel layer 114 of each pillar of the plurality of pillars 113 may include a silicon material having the same conductivity type as the substrate 111. In an embodiment, the channel layer 114 of each pillar of the plurality of pillars 113 may include, but not be limited to, p-type silicon. However, the channel layer 114 of each pillar of the plurality of pillars 113 is not limited to the p-type silicon.

An internal material 115 of each pillar of the plurality of pillars 113 may include an insulation material. For example, the internal material 115 of each pillar of the plurality of pillars 113 may include an insulation material such as, but not be limited to, a silicon oxide. In an example, the internal material 115 of each pillar 113 may include an air gap. As used herein, the term air may refer to atmospheric air and/or other gases that may be present during the manufacturing process.

An insulation layer 116 may be provided along the exposed surfaces of the insulation materials 112, the plurality of pillars 113, and the substrate 111, on a region between the first and second doping regions 311 and 312. For example, the insulation layer 116 provided on surfaces of the insulation material 112 may be interposed between the plurality of pillars 113 and a plurality of stacked first conductive materials (e.g., first conductive material 211, second conductive material 221, third conductive material 231, fourth conductive material 241, fifth conductive material 251, sixth conductive material 261, seventh conductive material 271, eighth conductive material 281, and ninth conductive material 291), as shown in FIG. 4. In some embodiments, the insulation layer 116 may not be provided between the first conductive materials 211 to 291 corresponding to ground selection lines GSL (e.g., first conductive material 211) and string selection lines SSL (e.g., ninth conductive material 291). In such embodiments, the ground selection lines GSL may be the lowermost ones of the stack of first conductive materials 211 to 291 and the string selection lines SSL may be the uppermost ones of the stack of first conductive materials 211 to 291.

The plurality of first conductive materials 211 to 291 may be provided on surfaces of the insulation layer 116, in a region between the first and second doping regions 311 and 312. For example, the first conductive material 211 extending along the first direction DR1 may be provided between the insulation material 112 adjacent to the substrate 111 and the substrate 111. That is, the first conductive material 211 extending along the first direction DR1 may be provided between the insulation layer 116 at the bottom of the insulation material 112 adjacent to the substrate 111 and the substrate 111.

A first conductive material extending along the first direction DR1 may be provided between the insulation layer 116 at the top of the specific insulation material from among the insulation materials 112 and the insulation layer 116 at the bottom of a specific insulation material from among the insulation materials 112. For example, a plurality of first conductive materials 221 to 281 extending along the first direction DR1 may be provided between the insulation materials 112. It is to be understood that the insulation layer 116 may be provided between the insulation materials 112 and the first conductive materials 221 to 281. The plurality of stacked first conductive materials 211 to 291 may be formed of a conductive metal. However, the present disclosure is not limited in this regard, and the plurality of stacked first conductive materials 211 to 291 may include a conductive material such as, but not limited to, a polysilicon in other embodiments.

The same and/or substantially similar structures as those on the first and second doping regions 311 and 312 may be provided in a region between the second and third doping regions 312 and 313. In the region between the second and third doping regions 312 and 313, a plurality of insulation materials 112 may be provided, which may extend along the first direction DR1. A plurality of pillars 113 may be provided that may be disposed sequentially along the first direction DR1 and at least partially penetrate the plurality of insulation materials 112 along the third direction DR3. An insulation layer 116 may be provided on the exposed surfaces of the plurality of insulation materials 112 and the plurality of pillars 113, and the plurality of stacked first conductive materials 211 to 291 may extend along the first direction DR1. Similarly, the same and/or substantially similar structures as those on the first and second doping regions 311 and 312 may be provided in a region between the third and fourth doping regions 313 and 314.

A plurality of drain regions 320 may be provided on the plurality of pillars 113, respectively. The drain regions 320 may include, but not be limited to, silicon materials doped with a second type of charge carrier impurity. For example, the drain regions 320 may include silicon materials doped with an n-type dopant. In an embodiment, the drain regions 320 may include n-type silicon materials. However, the drain regions 320 are not limited to n-type silicon materials.

On the drain regions, a plurality of second conductive materials (e.g., tenth conductive material 331, eleventh conductive material 332, and twelfth conductive material 333) may be provided, which may extend along the second direction DR2. The second conductive materials 331 to 333 may be disposed along the first direction DR1, being spaced apart from each other by a specific distance. The second conductive materials 331 to 333 may be respectively connected to the drain regions 320 in a corresponding region. The drain regions 320 and the twelfth conductive material 333 extending along the second direction DR2 may be connected through each contact plug. Each contact plug may be, for example, a conductive plug formed of a conductive material such as, but not limited to, a metal. The second conductive materials 331 to 333 may include metal materials. The second conductive materials 331 to 333 may include conductive materials such as, but not limited to, a polysilicon.

As shown in FIG. 4, the stacked first conductive materials 211 to 291 may be used to form the wordlines WL, the string selection lines SSL, and the ground selection lines GSL. For example, the stacked first conductive materials 221 to 281 may be used to form the wordlines WL, where conductive materials belonging to the same layer may be interconnected. The second conductive materials 331 to 333 may be used to form the bitlines BL. The number of layers of the stacked first conductive materials 211 to 291 may be variously determined according to process and control techniques.

Figure 5:
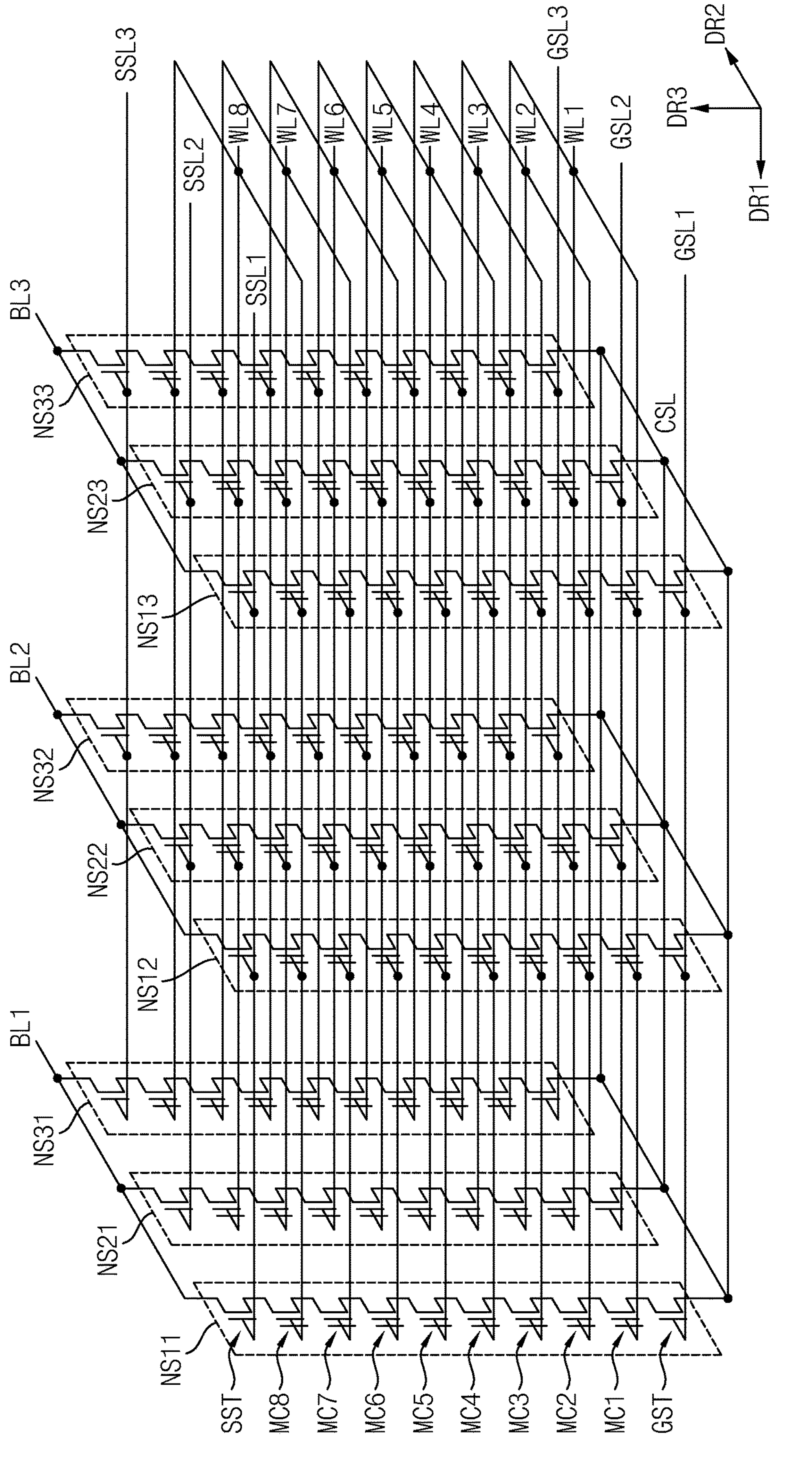
FIG. 5 is a circuit diagram illustrating an equivalent circuit of a memory block described with reference to FIG. 4, according to example embodiments.

FIG. 5 is a circuit diagram illustrating an equivalent circuit of a memory block described with reference to FIG. 4, according to example embodiments.

A memory block BLKi of FIG. 5 may be formed on a substrate in a 3D structure (or a vertical structure). For example, a plurality of cell strings included in the memory block BLKi may be formed in a direction perpendicular to the substrate.

Referring to FIG. 5, the memory block BLKi may include a plurality of cell strings (e.g., first cell string NS11, second cell string NS12, third cell string NS13, fourth cell string NS21, fifth cell string NS22, sixth cell string NS23, seventh cell string NS31, eighth cell string NS32, and ninth cell string NS33) that may be connected (e.g., communicatively coupled) between bitlines (e.g., first bitline BL1, second bitline BL2, and third bitline BL3) and a common source line CSL. Each of the cell strings NS11 to NS33 may include a string selection transistor SST, a plurality of memory cells (e.g., first memory cell MC1, second memory cell MC2, third memory cell MC3, fourth memory cell MC4, fifth memory cell MC5, sixth memory cell MC6, seventh memory cell MC7, and eighth memory cell MC8), and a ground selection transistor GST. For example, the bitlines BL1 to BL3 may correspond to the second conductive materials 331 to 333 in FIG. 4, and the common source line CSL may be formed by interconnecting the first to fourth doping regions 311 to 314 in FIG. 4.

Each string selection transistor SST may be connected to a corresponding string selection line (e.g., one of first string selection line SSL1, second string selection line SSL2, and third string selection line SSL3). The plurality of memory cells MC1 to MC8 may be connected (e.g., communicatively coupled) to corresponding wordlines (e.g., at least one of first wordline WL1, second wordline WL2, third wordline WL3, fourth wordline WL4, fifth wordline WL5, sixth wordline WL6, seventh wordline WL7, and eighth wordline WL8), respectively. Each ground selection transistor GST may be connected to a corresponding ground selection line (e.g., one of first ground selection line GSL1, second ground selection line GSL2, and third ground selection line GSL3). Each string selection transistor SST may be connected to a corresponding bitline (e.g., one of first to third bitlines BL1 to BL3), and each ground selection transistor GST may be connected to the common source line CSL. As shown in FIG. 5, some of the string selection transistors SST may be connected to the same bitline (e.g., one of first to third bitlines BL1 to BL3) to connect (e.g., communicatively connected) corresponding cell strings to the same bitline via appropriate selection via selection voltages applied to the appropriate first to third string selection lines SSL1 to SSL3 and first to third ground selection lines GSL1 to GSL3.

The cell strings connected in common to one bitline may form one column, and the cell strings connected to one string selection line may form one row. For example, the first, fourth, and seventh cell strings NS11, NS21 and NS31 connected to the first bitline BL1 may correspond to a first column, and the cell strings first, second, and third NS11, NS12 and NS13 connected to the first string selection line SSL1 may form a first row.

Wordlines (e.g., first wordline WL1) having the same height may be commonly connected, and the first to third ground selection lines GSL1 to GSL3 and the first to third string selection lines SSL1 to SSL3 may be separated. Memory cells located at the same semiconductor layer may share a wordline. Cell strings in the same row may share a string selection line. The common source line CSL may be connected in common to all of the cell strings.

Continuing to refer to FIG. 5, the memory block BLKi may be connected to first to eighth wordlines WL1 to WL8 and first to third bitlines BL1 to BL3, and each of the cell strings NS11 to NS33 may include first to eighth memory cells MC1 to MC8. However, example embodiments may not be limited thereto. In some example embodiments, each memory block may be connected to any number of wordlines and bitlines, and each cell string may include any number of memory cells.

A 3D vertical array structure may include vertical NAND strings that may be vertically oriented such that at least one memory cell is located over another memory cell. The at least one memory cell may comprise a charge trap layer. The following patent documents, the disclosures of which are incorporated by reference herein in their entireties, may describe suitable configurations for a memory cell array including a 3D vertical array structure, in which the 3D memory array is configured as a plurality of levels, with wordlines and/or bitlines shared between levels: U.S. Pat. Nos. 7,679,133, 8,553,466, 8,654,587, 8,559,235, and 9,536,970.

Although the memory cell array is described based on a vertical memory cell array, the memory cell array according to example embodiments may be any memory cell array, e.g., a planar (or two-dimensional) memory cell array. Although the nonvolatile memory device is described based on a NAND flash memory device, the nonvolatile memory device, according to example embodiments, may be and/or may include other types of nonvolatile memory devices, such as, but not limited to, phase random access memory (PRAM) devices, resistive random access memory (RRAM) devices, nano floating gate memory (NFGM) devices, polymer random access memory (PoRAM) devices, magnetic random access memory (MRAM) devices, a ferroelectric random access memory (FRAM), thyristor random access memory (TRAM) devices, and the like.

Figure 6A:
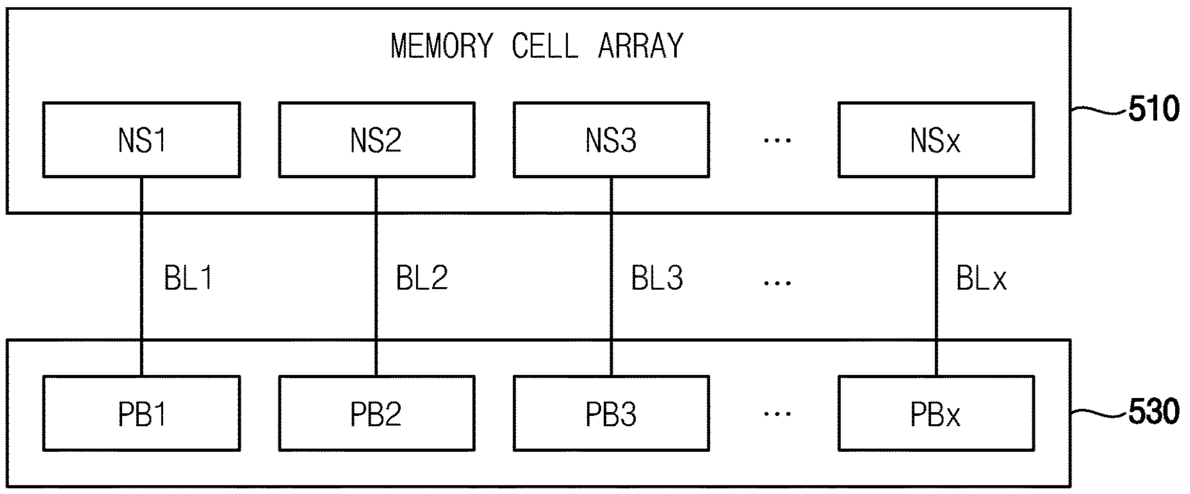
FIGS. 6A and 6B are diagrams illustrating an example of a memory cell array and an example of a page buffer circuit included in a nonvolatile memory device of FIG. 3, according to example embodiments.
Figure 6B:
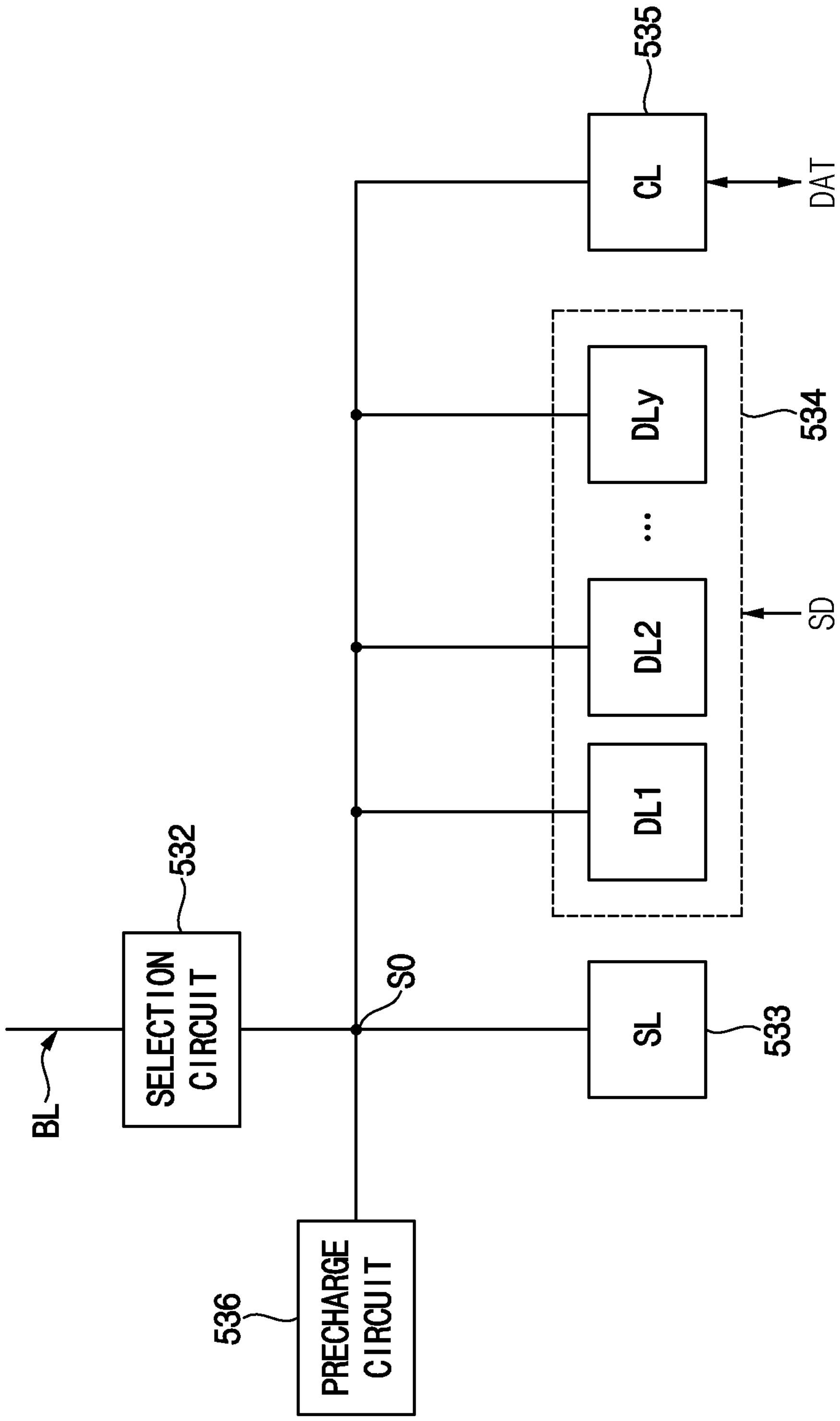

FIGS. 6A and 6B are diagrams illustrating an example of a memory cell array and an example of a page buffer circuit included in a nonvolatile memory device of FIG. 3, according to example embodiments.

Referring to FIG. 6A, the memory cell array 510 may include a plurality of cell strings (e.g., first cell string NS1, second cell string NS2, third cell string NS3, to x-th cell string NSx, where x is a positive integer greater than zero (0)). The page buffer circuit 530 may include a plurality of page buffers (e.g., first page buffer PB1, second page buffer PB2, third page buffer PB3, to x-th page buffer PBx).

The plurality of cell strings NS1 to NSx may extend in a direction perpendicular to a substrate, and may correspond to the cell strings NS11 to NS33 in FIG. 5. The plurality of cell strings NS1 to NSx may be connected to the plurality of page buffers PB1 to PBx, respectively, through a plurality of bitlines (e.g., first bitline BL1, second bitline BL2, third bitline BL3, to x-th bitline BLx), respectively. The page buffers PB1 to PBx may control the cell strings NS1 to NSx and the memory cells included therein.

For convenience of illustration, FIG. 6A illustrates an example where one page buffer is connected to one cell string, but example embodiments are not limited thereto. For example, two or more cell strings may be connected to one page buffer through one bitline, and/or one page buffer may control two or more cell strings.

Referring to FIG. 6B, a page buffer 531 may include a selection circuit 532, a sense latch (SL) 533, a plurality of data latches 534 (e.g., first data latch DL1, second data latch DL2, to y-th data latch DLy, where y is a positive integer greater than zero (0)), a cache latch (CL) 535, and a precharge circuit 536. In some embodiments, the page buffer 531 may further include a forcing latch, a switching circuit, and the like. For example, the page buffer 531 may include and/or may be similar in many respects to one of the page buffers PB1 to PBx described with reference to FIG. 6A.

The selection circuit 532 may be disposed between a bitline BL and a sensing node SO, and may electrically connect (e.g., couple) the bitline BL with the sensing node SO based on a selection control signal (e.g., a bit line shut-off signal). For example, the selection circuit 532 may include at least one transistor that may be turned on and/or off in response to the selection control signal.

During the program operation and/or the read operation, the precharge circuit 536 may precharge the corresponding bitline (or selected bitline) BL. For example, the precharge circuit 536 may supply a precharge voltage to the corresponding bitline BL.

After a sensing operation, the sense latch 533 may store data programmed in a memory cell connected to the corresponding bitline (or selected bitline) BL by sensing a voltage at the sensing node SO and by latching the sensed value. In addition, before the sensing operation, the sense latch 533 may store data indicating whether the memory cell connected to the corresponding bitline BL is a target of the sensing operation (e.g., data indicating a selection of the corresponding bitline BL).

During the program operation, the plurality of data latches 534 may store the state data SD corresponding to a state to be programmed. For example, when the memory cell connected to the corresponding bitline BL stores 2-bit data, 3-bit data, or 4-bit data, the number of the data latches 534 may be two, three, or four, respectively, and the state data SD having two bits, the state data SD having three bits, or the state data SD having four bits may be loaded into two data latches 534, three data latches 534, or four data latches 534, respectively. In example embodiments, the plurality of data latches 534 may further include at least one data latch for data backup.

During the program operation, the cache latch 535 may receive data (e.g., program data) DAT to be programmed bit by bit, and may transfer (or transmit) the data DAT to the data latches 534.

In some example embodiments, data transfers between the latches 533 to 535 may be performed based on a set operation and/or a reset operation on the sense latch 533, the data latches 534, and the cache latch 535. For example, at least one of the data latches 534 may be set and/or reset based on a bit stored in the cache latch 535, and thus data loaded into the cache latch 535 may be transferred to the data latches 534. For example, the sense latch 533 may be set and/or reset based on bits loaded into the data latches 534, and/or at least one of the data latches 534 may be set and/or reset based on bit loaded into the sense latch 533. For example, among the data latches 534, at least one data latch may be set and/or reset based on at least one bit loaded into at least one another data latch. Such data transfer may be referred to as a data dump operation or simply a dump operation.

In some example embodiments, when the state ordering is swapped and/or re-swapped, a bit loaded into at least one of the data latches 534 may be changed (e.g., changed from '0' to '1' and/or from '1' to '0'), based on the state ordering control signal SC and the state data SD.

Figure 7:
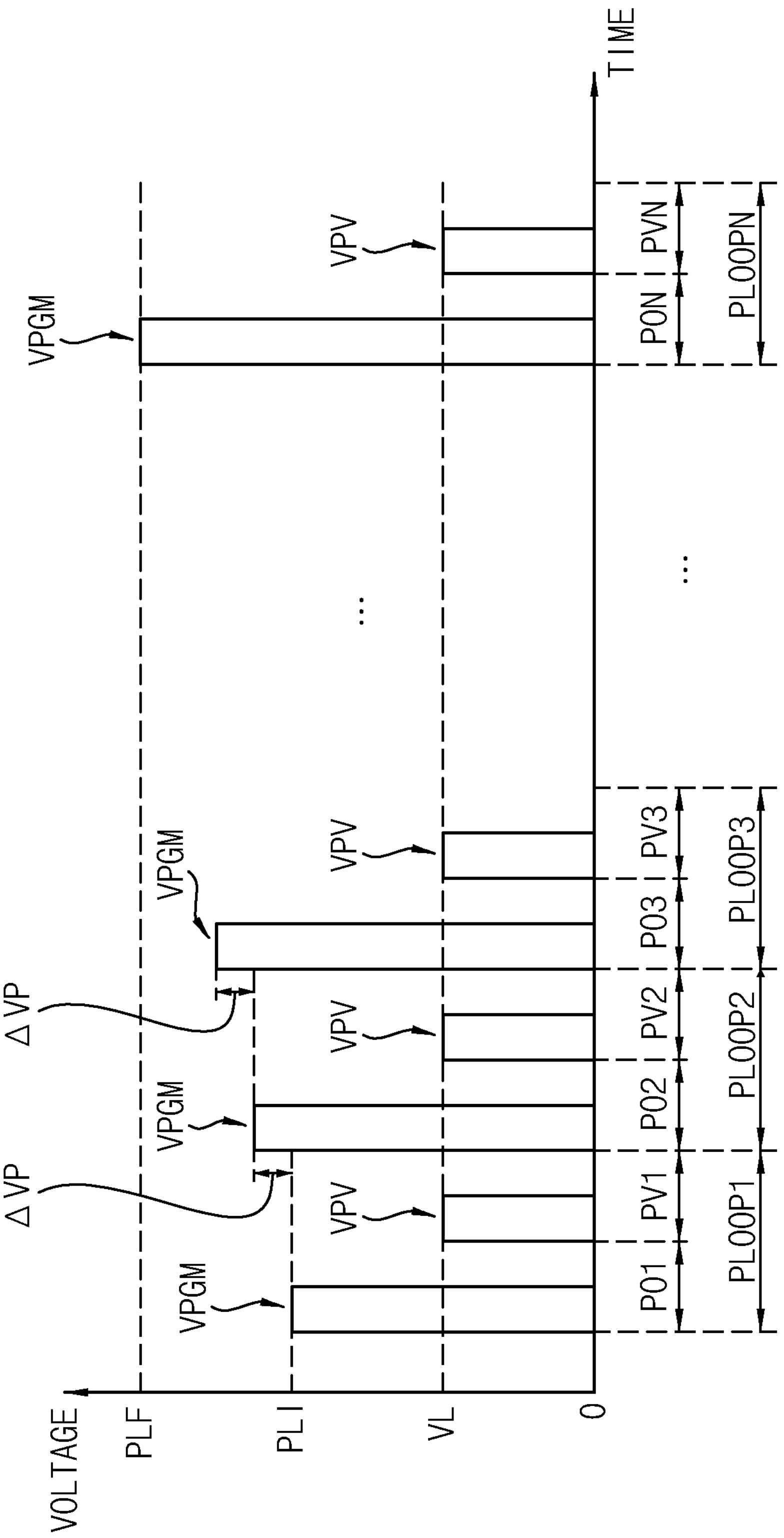
FIG. 7 is a diagram for describing a program operation performed in a nonvolatile memory device, according to example embodiments.

FIG. 7 is a diagram for describing a program operation performed in a nonvolatile memory device, according to example embodiments.

Referring to FIG. 7, the program operation may be performed based on an incremental step pulse program (ISPP) scheme.

For example, a plurality of program loops (e.g., first program loop PLOOP1, second program loop PLOOP2, third program loop PLOOP3, to N-th program loop PLOOPPN may be sequentially performed, where N is a positive integer greater than zero (0)). For each program loop, a respective one of program execution operations (e.g., first program operation PO1, second program operation PO2, third program operation PO3, to N-th program operation PON) using the program voltage VPGM and a respective one of program verification operations (e.g., first program verification operation PV1, second program verification operation PV2, third program verification operation PV3, to N-th program verification operation PVN) using the program verification voltage PVP may be sequentially performed. When a program execution operation and a program verification operation in a specific program loop (e.g., in the third program loop PLOOP3) are successfully completed, subsequent program loops (e.g., the N-th program loop PLOOPN) may not be performed, and the process may be terminated.

In some example embodiments, a voltage level of the program voltage VPGM in a current program loop may be higher than that of the program voltage VPGM in a previous program loop, and/or the program verification voltage VPV may have a constant voltage level VL. For example, in the first program loop PLOOP1, the program voltage VPGM may have an initial voltage level PLI. In the second program loop PLOOP2, the program voltage VPGM may have a voltage level that increases by a step level ΔVP from the initial voltage level PLI. In the third program loop PLOOP3, the program voltage VPGM may have a voltage level that increases by the step level ΔVP from the voltage level of the program voltage VPGM in the second program loop PLOOP2. In the N-th program loop PLOOPN which may be the last program loop, the program voltage VPGM may have a final voltage level PLF.

Although FIG. 7 illustrates that the program verification voltage VPV maintains the constant voltage level VL, example embodiments are not limited thereto, and the voltage level of the program verification voltage VPV may be changed as the program loops are repeatedly performed. Alternatively or additionally, although FIG. 7 illustrates that the voltage level of the program voltage VPGM increases by a fixed level (e.g., the step level ΔVP) as the program loops are repeatedly performed, example embodiments are not limited thereto, and the amount of change in the program voltage VPGM may be changed for each program loop.

In some example embodiments, the program operation may be performed based on a multi-pulse program scheme in which the program voltage VPGM is applied multiple times while changing the voltage level of the program voltage VPGM during one program loop. In some example embodiments, the program operation may be performed based on a scheme in which the program verification voltage VPV is applied multiple times while changing the voltage level of the program verification voltage VPV during one program loop.

Figure 8A:
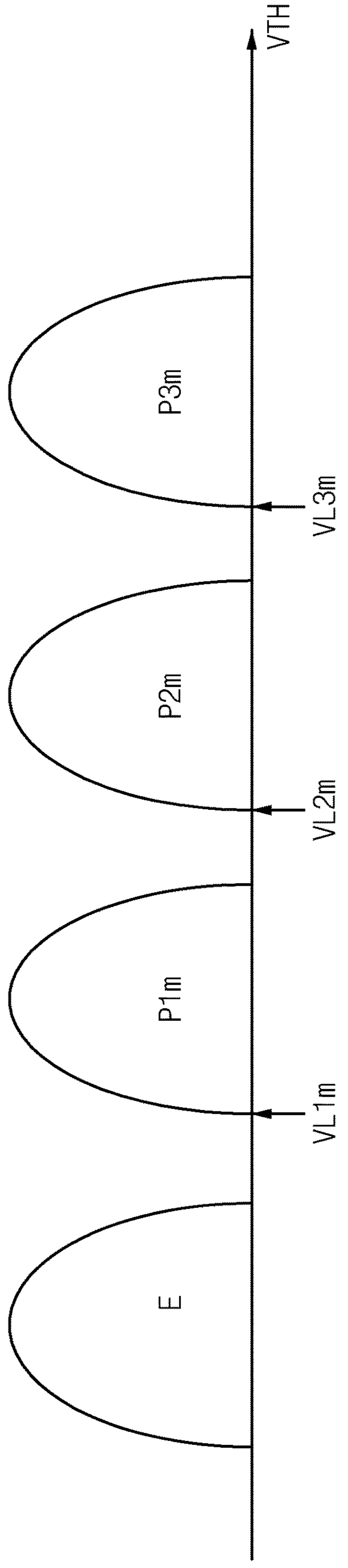
FIGS. 8A, 8B, and 8C are diagrams for describing a threshold voltage distribution associated with data stored in a nonvolatile memory device, according to example embodiments.
Figure 8B:
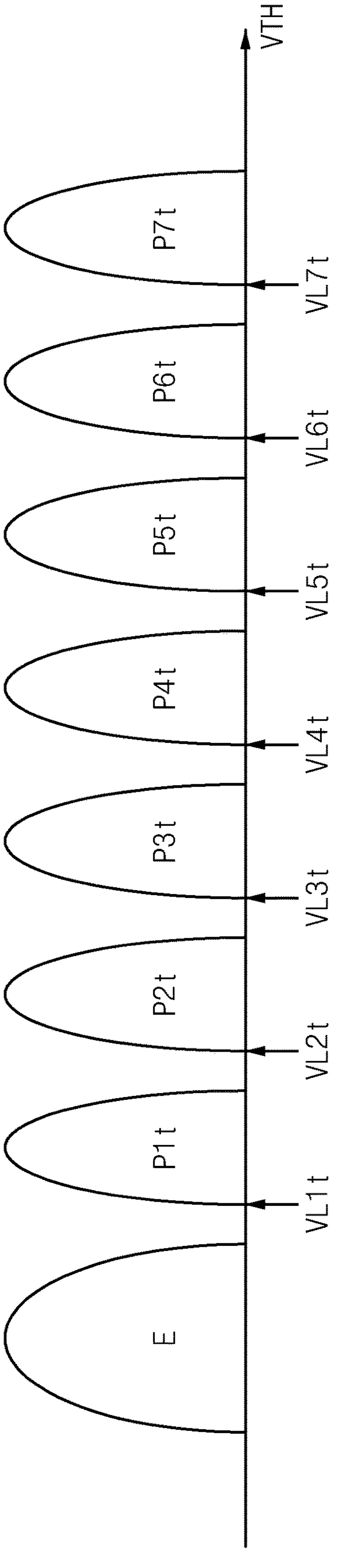
Figure 8C:
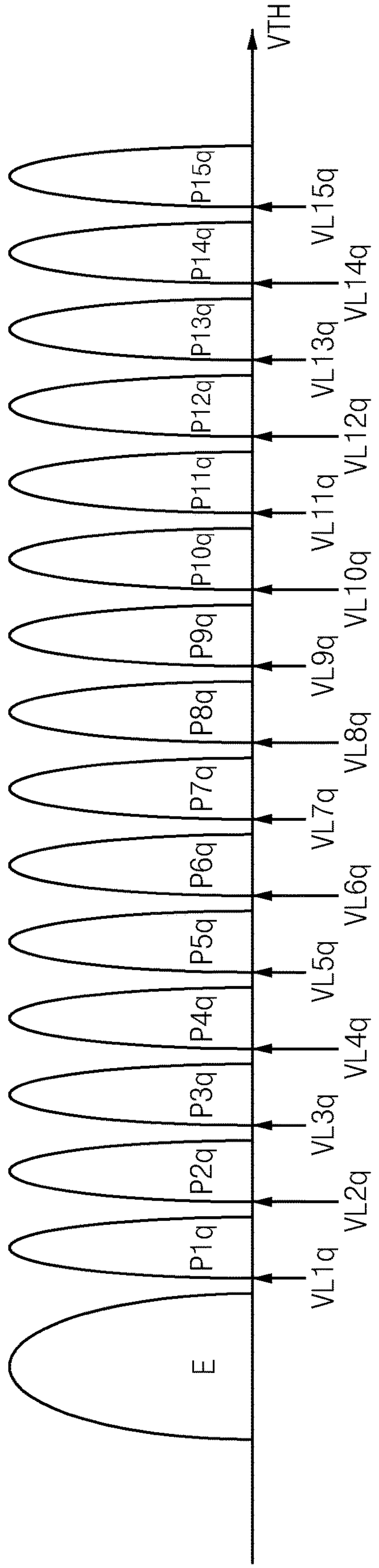

FIGS. 8A, 8B and 8C are diagrams for describing a threshold voltage distribution associated with data stored in a nonvolatile memory device, according to example embodiments.

Referring to FIG. 8A, an example of a threshold voltage distribution where 2-bit data are stored in memory cells (e.g., where each memory cell is a multi-level cell (MLC) that stores data having two bits) is illustrated.

Each MLC may be programmed to have one of a plurality of states (e.g., erase state E, first program state P1*m*, second program state P2*m*, and third program state P3*m*). That is, a threshold voltage distribution of MLCs may include a plurality of states E and P1*m* to P3*m*. For example, the state E may represent an erase state, and the states P1*m* to P3*m* may represent a plurality of program states. A plurality of threshold voltage levels (e.g., first voltage level VL1*m*, second voltage level VL2*m*, and third voltage level VL3*m*) may be used to distinguish and/or determine the plurality of states E and P1*m* to P3*m*. For example, the threshold voltage level VL1*m* may be used to distinguish and/or determine whether the memory cell is in the erase state E or the first program state P1*m*.

Referring to FIG. 8B, an example of a threshold voltage distribution where 3-bit data are stored in memory cells (e.g., where each memory cell is a triple-level cell (TLC) that stores data having three bits) is illustrated. The example depicted in FIG. 8B may be similar in many respects to the example depicted in FIG. 8A, and as such, repeated descriptions of the example described above with reference to FIG. 8A may be omitted for the sake of brevity.

Each TLC may be each programmed to have one of a plurality of states (e.g., erase state E, first program state P1*t*, second program state P2*t*, third program state P3*t*, fourth program state P4*t*, fifth program state P5*t*, sixth program state P6*t*, and seventh program state P7*t*). That is, a threshold voltage distribution of TLCs may include the plurality of states E and P1*t* to P7*t*. A plurality of threshold voltage levels (e.g., first voltage level VLIt, second voltage level VL2*t*, third voltage level VL3*t*, fourth voltage level VL4*t*, fifth voltage level VL5*t*, sixth voltage level VL6*t*, and seventh voltage level VL7*t*) may be used to distinguish the plurality of states E and P1*t* to P7*t*.

Referring to FIG. 8C, an example of a threshold voltage distribution where 4-bit data are stored in memory cells (e.g., where each memory cell is a quadruple-level cell (QLC) that stores data having four bits) is illustrated. The example depicted in FIG. 8C may be similar in many respects to the examples depicted in FIGS. 8A and 8B, and as such, repeated descriptions of the example described above with reference to FIGS. 8A and 8B may be omitted for the sake of brevity.

Each QLC may be each programmed to have one of a plurality of states (e.g., erase state E, first program state P1*q*, second program state P2*q*, third program state P3*q*, fourth program state P4*q*, fifth program state P5*q*, sixth program state P6*q*, seventh program state P7*q*, eighth program state P8*q*, ninth program state P9*q*, tenth program state P10*q*, eleventh program state P11*q*, twelfth program state P12*q*, thirteenth program state P13*q*, fourteenth program state P14*q*, and fifteenth program state P15*q*). That is, a threshold voltage distribution of QLCs may include the plurality of states E and P1*q* to P15*q*. A plurality of threshold voltage levels (e.g., first voltage level VLIq, second voltage level VL2q, third voltage level VL3q, fourth voltage level VL4q, fifth voltage level VL5q, sixth voltage level VL6q, seventh voltage level VL7q, eighth voltage level VL8q, ninth voltage level VL9q, tenth voltage level VL10q, eleventh voltage level VL11q, twelfth voltage level VL12q, thirteenth voltage level VL13q, fourteenth voltage level VL14q, and fifteenth voltage level VL15q) may be used to distinguish the plurality of states E and P1q to P15q.

The program states P1m to P3m, P1t to P7t, and P1q to P15q illustrated in FIGS. 8A, 8B, and 8C may be formed according to various sequences based on various program algorithms.

In some example embodiments, memory cells may be programmed based on a one-shot scheme in which all program states are formed at once. For example, the MLCs may be programmed such that all of the program states P1m to P3m in FIG. 8A are formed at once. Similarly, the TLCs may be programmed such that all of the program states P1t to P7t in FIG. 8B are formed at once, and the QLCs may be programmed such that all of the program states P1q to P15q in FIG. 8C are formed at once.

In some example embodiments, memory cells may be programmed based on a multi-step scheme in which program states are formed through a plurality of steps. For example, in the example of FIG. 8A, the MLCs may be programmed based on a 2-step scheme in which an initial program state is formed and then and the program states P1m to P3m are formed from the erase state E and the initial program state, or based on a 3-step scheme in which the first program state P1m, the second program state P2m, and the third program state P3m are sequentially formed. Similarly, in the example of FIG. 8B, the TLCs may be programmed based on a 2-step scheme, a 3-step scheme or a 7-step scheme. In the example of FIG. 8C, the QLCs may be programmed based on a 2-step scheme, a 3-step scheme, a 4-step scheme or a 15-step scheme.

In some example embodiments, various program schemes, such as a shadow program scheme, a reprogram scheme or an on-chip buffered program scheme, may be used or employed. The present disclosure is not limited in this regard.

Although example embodiments are described based on the MLC, the TLC and the QLC, the memory cell included in the nonvolatile memory device, according to example embodiments, may be any multi-bit cell that stores data having k bits and is programmed to have one of 2k states, where k is a positive integer greater than zero (0).

Figure 9:
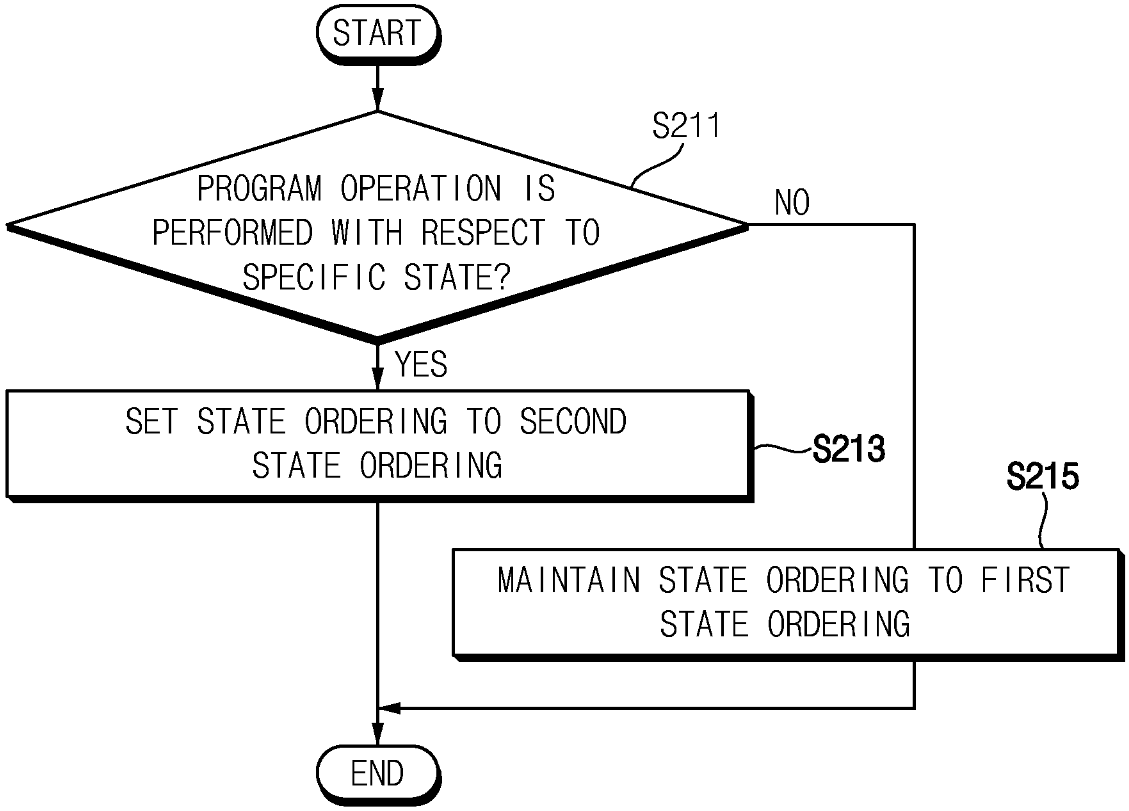
FIG. 9 is a flowchart illustrating an example of swapping a state ordering from a first state ordering to a second state ordering in FIG. 2, according to example embodiments.
Figure 10A:
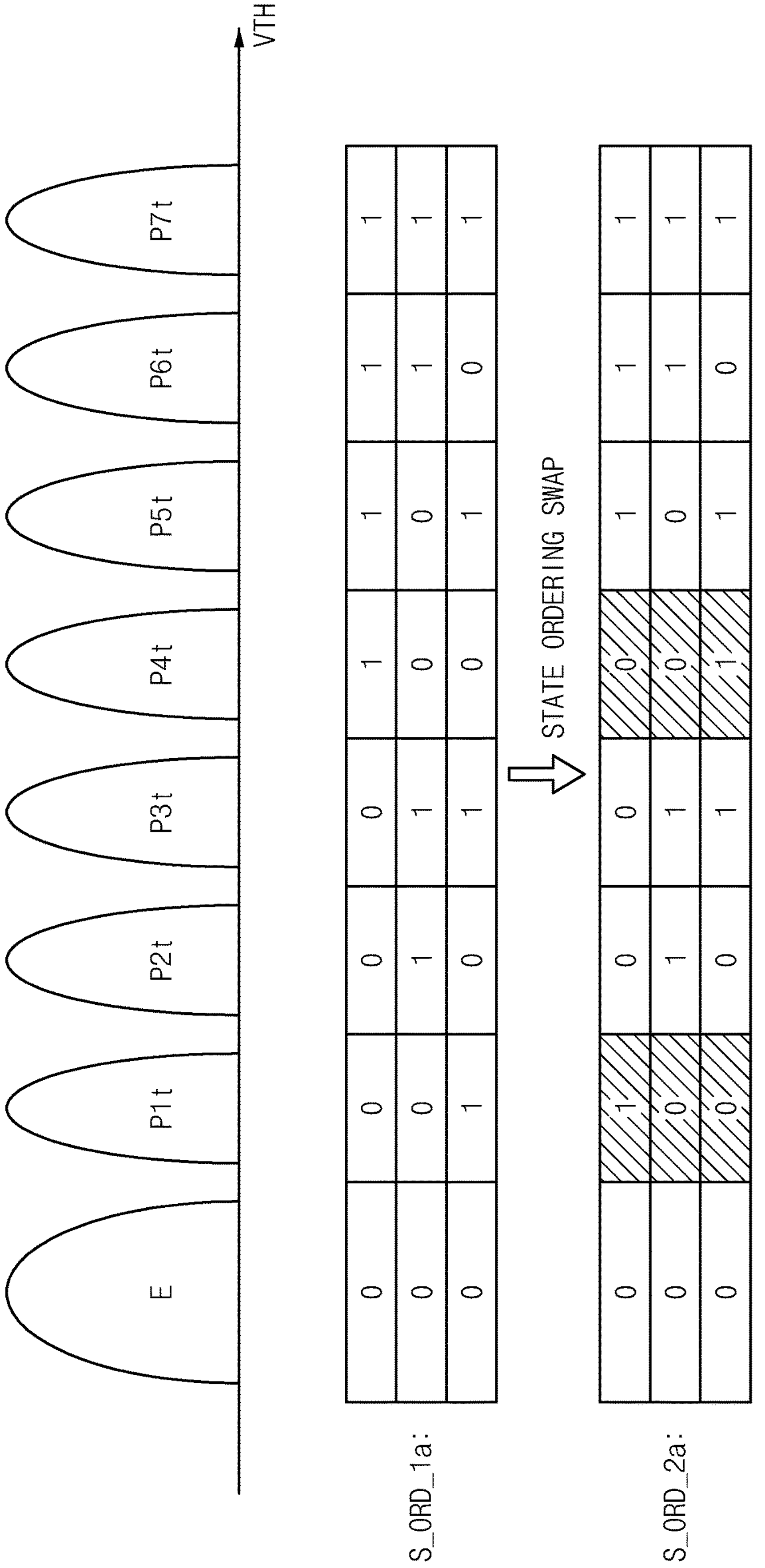
FIGS. 10A and 10B are diagrams for describing an operation of FIG. 9, according to example embodiments.
Figure 10B:
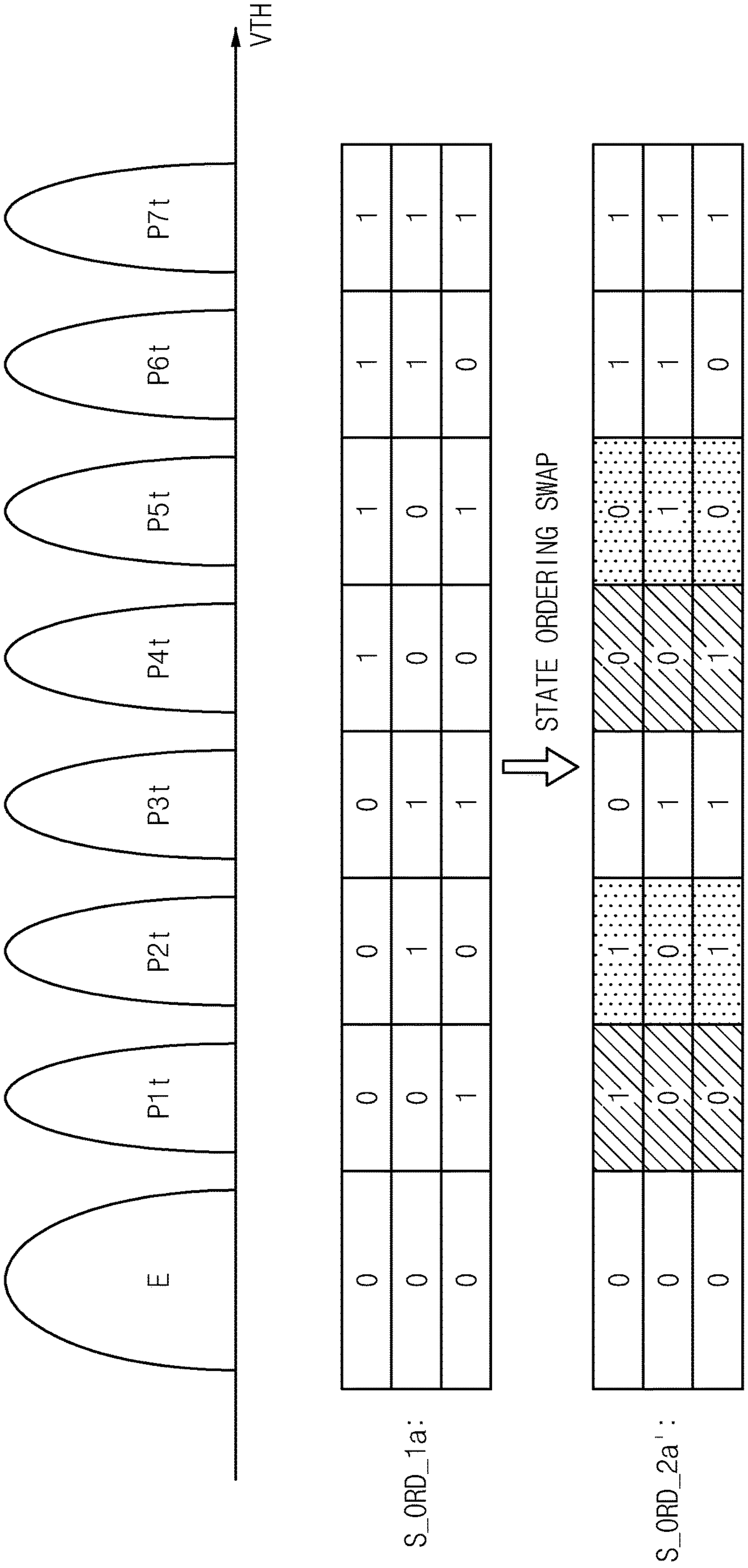

FIG. 9 is a flowchart illustrating an example of swapping a state ordering from a first state ordering to a second state ordering in FIG. 2, according to example embodiments. FIGS. 10A and 10B are diagrams for describing an operation of FIG. 9, according to example embodiments.

Referring to operation S210 of FIG. 2, the swapping of the state ordering may include checking and/or identifying whether the program operation is performed with respect to a specific state (e.g., a first state) from among the plurality of states (operation S211). For example, the threshold voltages of the target memory cells may be checked to determine whether the threshold voltages are lower than a first threshold voltage level corresponding to the first state. For example, the first state may be one of the plurality of program states included in the plurality of states.

When it is checked or identified that the program operation is performed with respect to the specific state (operation S211: YES) (e.g., when the threshold voltages of the target memory cells are lower than the first threshold voltage level), the state ordering may be set to the second state ordering (operation S213), and thus the state ordering may be swapped and/or changed from the first state ordering to the second state ordering.

When it is checked or identified that the program operation is not performed with respect to the specific state (operation S211: NO), the state ordering may be maintained to the first state ordering (operation S215).

Referring to FIG. 10A, an example where the state ordering is swapped from a first state ordering S_ORD_1a to a second state ordering S_ORD_2a in the TLC is illustrated, and an example where the first state in operation S211 of FIG. 9 is the first program state P1t is illustrated.

In the first state ordering S_ORD_1a, the plurality of states E and P1t to P7t of TLCs and a plurality of data values '000', '001', '010', '011', '100', '101', '110', and '111' of 3-bit data may have a first relationship (or mapping). For example, in the first state ordering S_ORD_1a, the erase state E may correspond to the data value '000', the first program state P1t may correspond to the data value '001', the second program state P2t may correspond to the data value '010', the third program state P3t may correspond to the data value '011', the fourth program state P4t may correspond to the data value '100', the fifth program state P5t may correspond to the data value '101', the sixth program state P6t may correspond to the data value '110', and the seventh program state P7t may correspond to the data value '111'.

In some example embodiments, each of the data values of the 3-bit data may include a most significant bit (MSB), a central significant bit (CSB), and a least significant bit (LSB). For example, in the data value '011' corresponding to the third program state P3t, a MSB, a CSB, and a LSB may be '0', '1' and '1', respectively.

When the program operation is performed with respect to the first program state P1t (e.g., when the threshold voltages of the target memory cells are lower than the threshold voltage level VLIt), the state ordering may be swapped and/or changed from the first state ordering S_ORD_1a to the second state ordering S_ORD_2a.

In the second state ordering S_ORD_2a, the plurality of states E and P1t to P7t of TLCs and the plurality of data values '000' to '111' of 3-bit data may have a second relationship that may be different from the first relationship. As compared to the first state ordering S_ORD_1a, the correspondence between the states E and P1t to P7t and the data values '000' to '111' may be partially changed in the second state ordering S_ORD_2a. For example, in the second state ordering S_ORD_2a, the first program state P1t may correspond to the data value '100', and the fourth program state P4t may correspond to the data value '001'. That is, as compared to the first state ordering S_ORD_1a, the data values '001' and '100' corresponding to the first and fourth program states P1t and P4t may be exchanged with each other in the second state ordering S_ORD_2a. The data values '000', '010', '011', '101', '110', and '111' corresponding to the remaining states E, P2t, P3t, P5t, P6t, and P7t may not be changed and may be maintained.

Referring to FIG. 10B, another example where the state ordering is swapped from a first state ordering S_ORD_1a to a second state ordering S_ORD_2a' in the TLC is illustrated. The example depicted in FIG. 10B may be similar in many respects to the example depicted in FIG. 10A, and as such, repeated descriptions of the example described above with reference to FIG. 10A may be omitted for the sake of brevity.

As shown in FIG. 10B, in the second state ordering S_ORD_2a', the first program state P1t may correspond to the data value '100', the fourth program state P4*t* may correspond to the data value '001', the second program state P2*t* may correspond to the data value '101', and the fifth program state P5*t* may correspond to the data value '010'. That is, as compared to the first state ordering S_ORD_1*a*, the data values '001' and '100' corresponding to the first and fourth program states P1*t* and P4*t* may be exchanged with each other and the data values '010' and '101' corresponding to the second and fifth program states P2*t* and P5*t* may be exchanged with each other, in the second state ordering S_ORD_2*a*'. The data values '000', '011', '110', and '111' corresponding to the remaining states E, P3*t*, P6*t*, and P7*t* may not be changed and may be maintained.

Although examples where data values corresponding to specific states are changed are illustrated, example embodiments are not limited thereto. Although examples where data values corresponding to two states are exchanged with each other are illustrated, example embodiments are not limited thereto, and data values corresponding to three or more states may be exchanged with each other. Although examples where only data values corresponding to some states are changed are illustrated, example embodiments are not limited thereto, and data values corresponding to all states may be changed.

Figure 11:
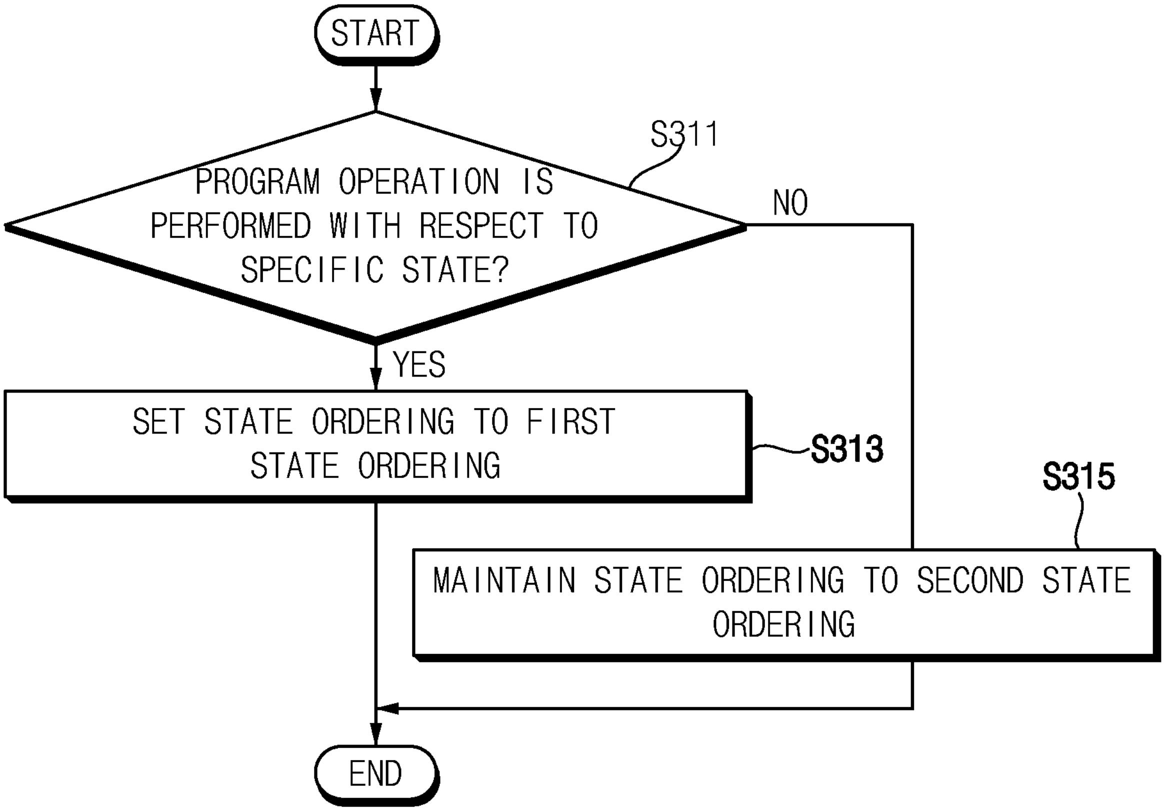
FIG. 11 is a flowchart illustrating an example of re-swapping a state ordering from a second state ordering to a first state ordering in FIG. 2, according to example embodiments.
Figure 12A:
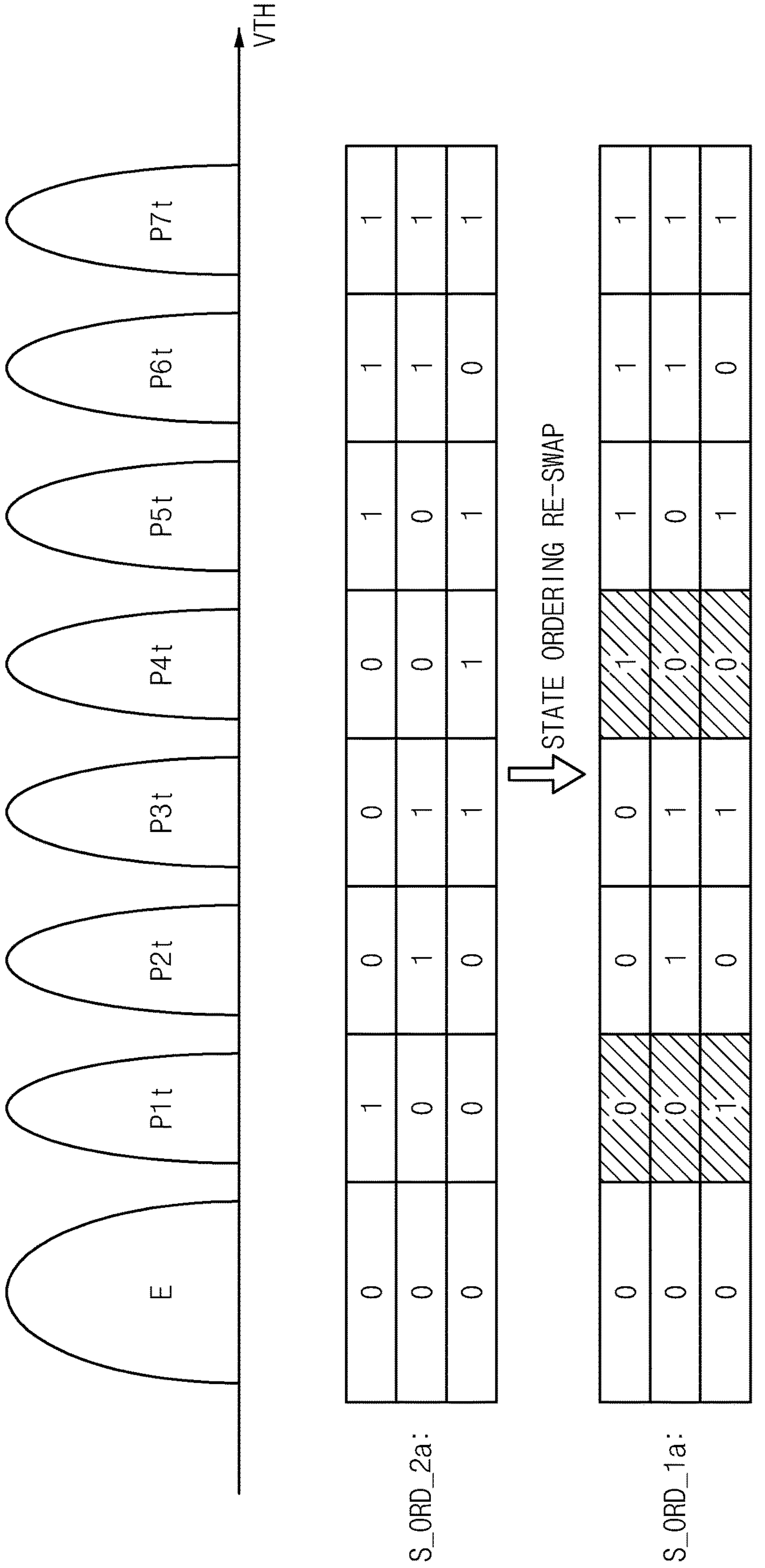
FIGS. 12A and 12B are diagrams for describing an operation of FIG. 11, according to example embodiments.
Figure 12B:
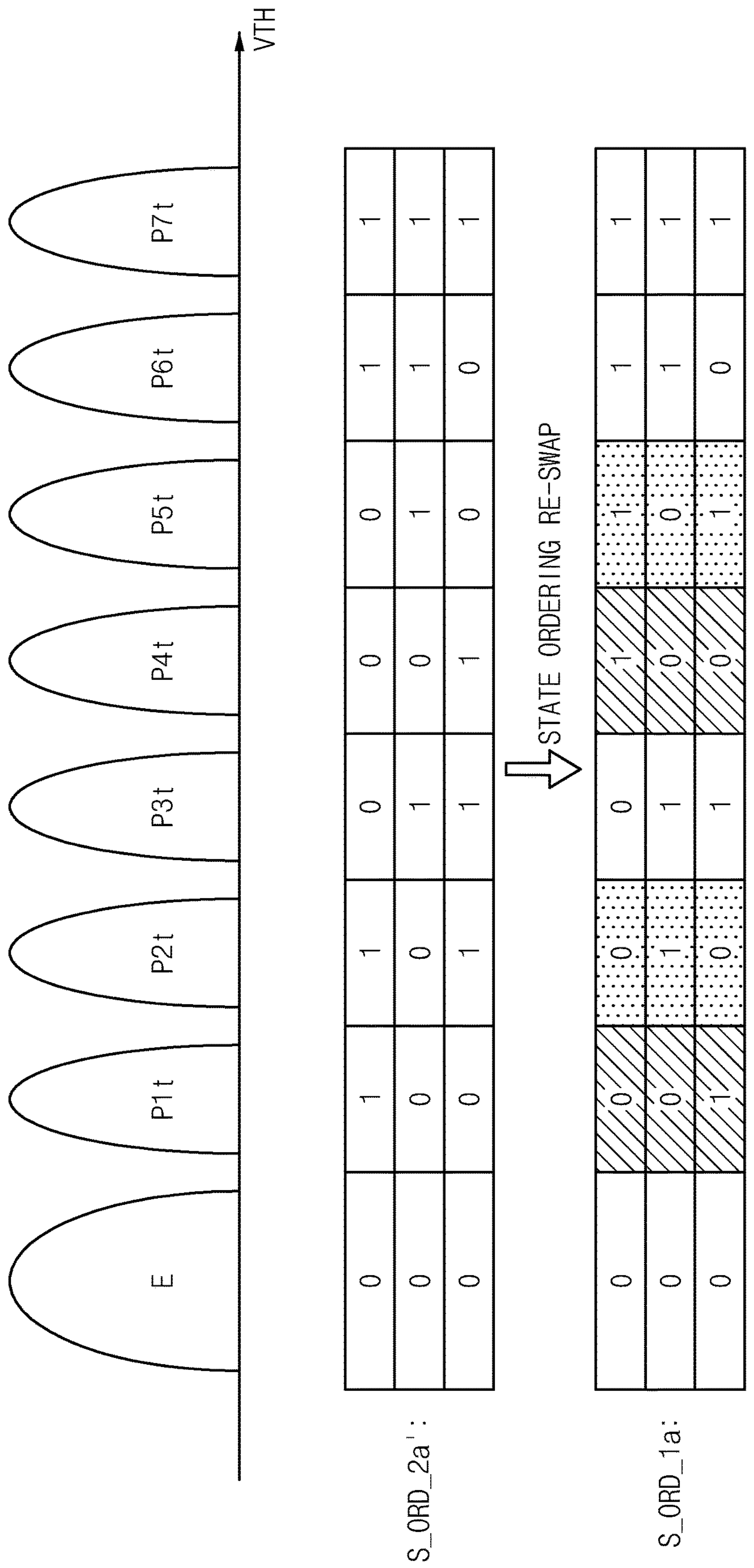

FIG. 11 is a flowchart illustrating an example of re-swapping a state ordering from a second state ordering to a first state ordering in FIG. 2, according to example embodiments. FIGS. 12A and 12B are diagrams for describing an operation of FIG. 11, according to example embodiments.

Referring to operation S310 of FIG. 2, it may be checked whether the program operation is performed with respect to another specific state (e.g., a second state different from the first state) from among the plurality of states (operation S311). For example, it may be checked whether the threshold voltages of the target memory cells are close (e.g., similar) to a second threshold voltage level corresponding to the second state. As another example, the second state may be another one of the plurality of program states included in the plurality of states. For example, in the second state ordering, the data value corresponding to the first state and the data value of the second state may be exchanged with each other.

When it is checked that the program operation is performed with respect to the another specific state (operation S311: YES) (e.g., when the threshold voltages of the target memory cells are close to the second threshold voltage level), the state ordering may be set to the first state ordering (operation S313), and thus the state ordering may be re-swapped and/or changed back from the second state ordering to the first state ordering.

When it is checked that the program operation is not performed with respect to the another specific state (operation S311: NO), the state ordering may be maintained to the second state ordering (operation S315).

Referring to FIG. 12A, an example where the state ordering is re-swapped from the second state ordering S_ORD_2*a* to the first state ordering S_ORD_1*a* in the TLC is illustrated, and an example where the second state in operation S311 of FIG. 11 is the fourth program state P4*t* is illustrated. The example depicted in FIG. 12A may be similar in many respects to the example depicted in FIG. 10A, and as such, repeated descriptions of the example described above with reference to FIG. 10A may be omitted for the sake of brevity.

When the program operation is performed with respect to the fourth program state P4*t* (e.g., when the threshold voltages of the target memory cells are close to the threshold voltage level VL4*t*), the state ordering may be re-swapped and/or changed back from the second state ordering S_ORD_2*a* to the first state ordering S_ORD_1*a*.

Referring to FIG. 12B, another example where the state ordering is re-swapped from the second state ordering S_ORD_2*a*' to the first state ordering S_ORD_1*a* in the TLC is illustrated. The example depicted in FIG. 12B may be similar in many respects to the examples depicted in FIGS. 10A and 12A, and as such, repeated descriptions of the examples described above with reference to FIGS. 10A and 12A may be omitted for the sake of brevity.

FIGS. 13A, 13B, 13C, 14A, 14B, and 15 are diagrams for describing a method of programming data in a nonvolatile memory device of FIG. 2, according to example embodiments.

Figure 13A:
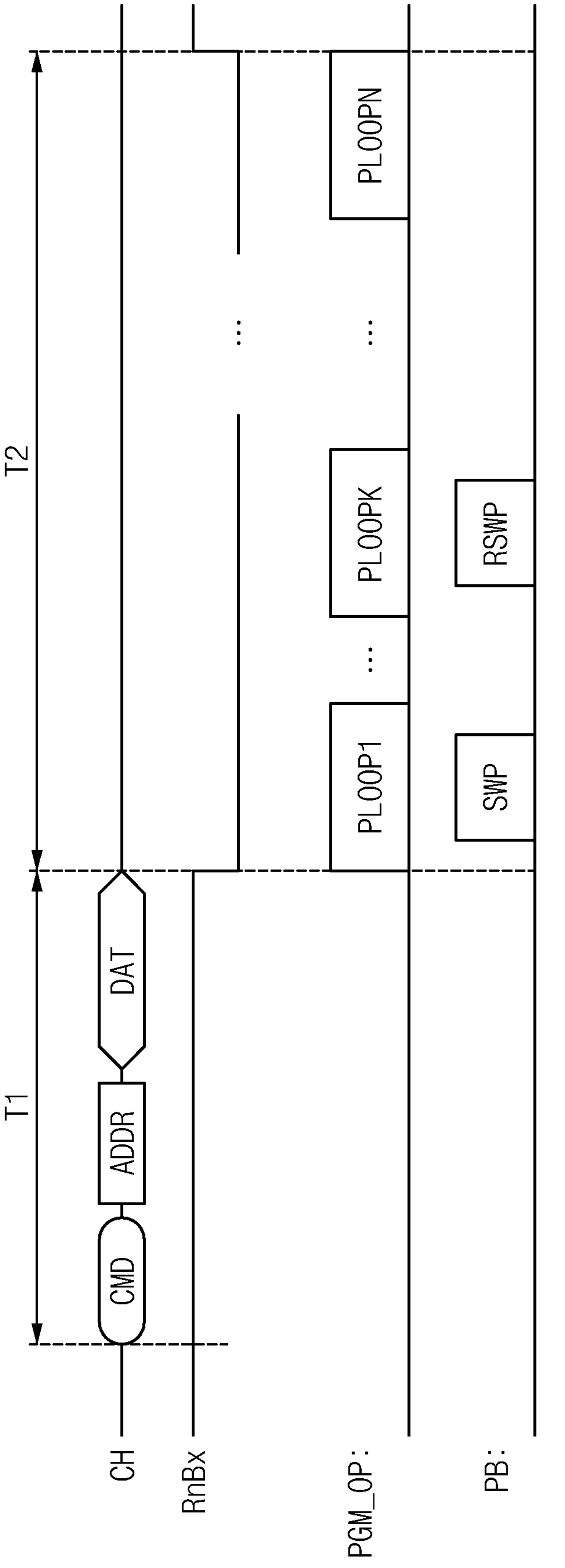
FIGS. 13A, 13B, 13C, 14A, 14B, and 15 are diagrams for describing a method of programming data in a nonvolatile memory device of FIG. 2, according to example embodiments.
Figure 22:
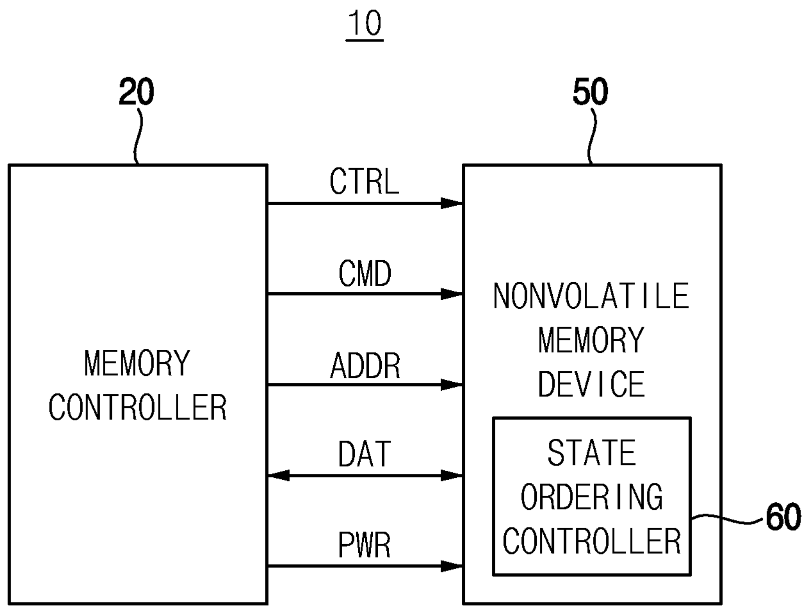
FIG. 22 is a block diagram illustrating a memory system including a nonvolatile memory device, according to example embodiments.

Referring to FIG. 13A, a nonvolatile memory device (e.g., the nonvolatile memory device 500 of FIG. 3) may transmit a ready-busy signal RnBx to a memory controller (e.g., the memory controller 20 of FIG. 22). When the ready-busy signal RnBx has a first level (e.g., a logic high level), the nonvolatile memory device may receive a command CMD, an address ADDR and data DAT from the memory controller through an input/output (I/O) channel CH. For example, the command CMD, the address ADDR and the data DAT may be received during a first time interval T1.

The nonvolatile memory device may set the ready-busy signal RnBx to a second level (e.g., a logic low level), and may perform a program operation PGM_OP on a memory cell array (e.g., the memory cell array 510 of FIG. 3). For example, the program operation PGM_OP may be performed during a second time interval T2 subsequent to the first time interval T1.

The program operation PGM_OP may include first to N-th program loops (e.g., first program loop PLOOP1, to K-th program loop PLOOPK, to N-th program PLOOPN, where N is a positive integer greater than zero (0) and K is a positive integer greater than zero (0) and smaller (less) than or equal to N). As described with reference to FIG. 7, each of the first to N-th program loops PLOOP1 to PLOOPN may include a program execution interval during which the program voltage VPGM is applied to the target memory cells and a program execution operation is performed, and a verification interval during which the program verification voltage VPV is applied to the target memory cells and a program verification operation is performed.

A state ordering controller (e.g., the state ordering controller 562 of FIG. 3) may control a page buffer PB to perform a state ordering swapping operation SWP and a state ordering re-swapping operation RSWP in a specific program loop. For example, the state ordering swapping operation SWP in which the state ordering is changed from the first state ordering to the second state ordering, described with reference to FIGS. 9, 10A, and 10B, may be performed during the first program loop PLOOP1. For example, the state ordering re-swapping operation RSWP in which the state ordering is changed back from the second state ordering to the first state ordering, described with reference to FIGS. 11, 12A, and 12B, may be performed during the K-th program loop PLOOPK subsequent to the first program loop PLOOP1.

In some example embodiments, while performing the program operation PGM_OP, the page buffer PB may perform the state ordering swapping operation SWP and the state ordering re-swapping operation RSWP as background operations.

Figure 13B:
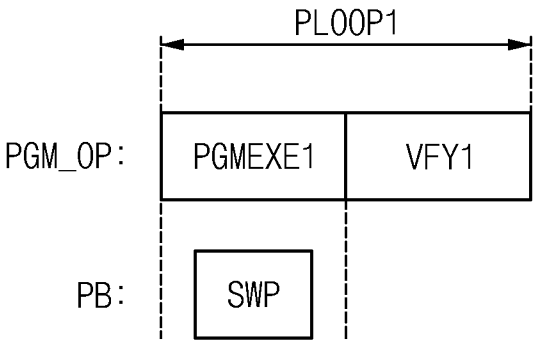

Referring to FIG. 13B, the first program loop PLOOP1 may include a first program execution interval PGMEXE1 during which the program voltage VPGM is applied to the target memory cells, and a first verification interval VFY1 during which the program verification voltage VPV is applied to the target memory cells. The state ordering swapping operation SWP in which the state ordering is changed from the first state ordering to the second state ordering may be performed during the first program execution interval PGMEXE1 of the first program loop PLOOP1.

Figure 13C:
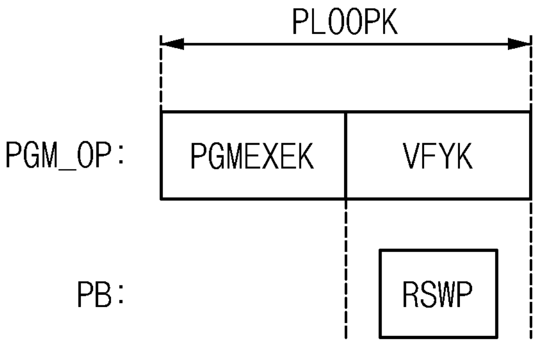

Referring to FIG. 13C, the K-th program loop PLOOPK may include a K-th program execution interval PGMEXEK during which the program voltage VPGM is applied to the target memory cells, and a K-th verification interval VFYK during which the program verification voltage VPV is applied to the target memory cells. The state ordering re-swapping operation RSWP in which the state ordering is changed back from the second state ordering to the first state ordering may be performed during the K-th verification interval VFYK of the K-th program loop PLOOPK.

Figure 14A:
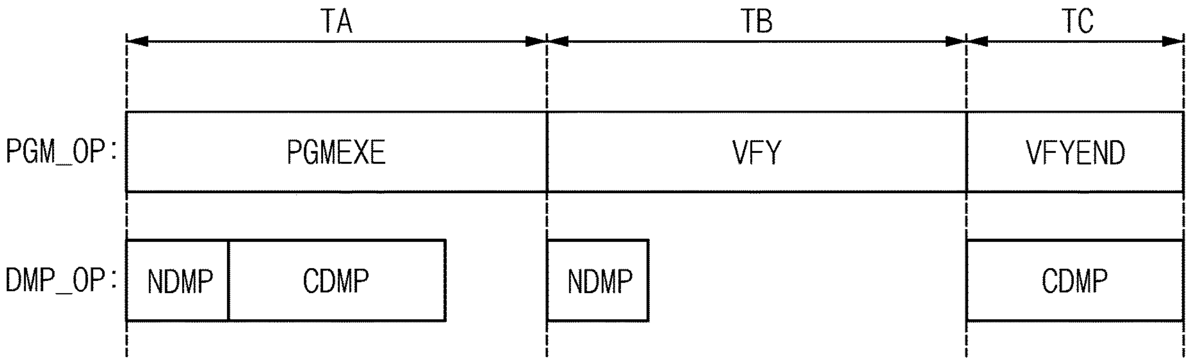

Referring to FIG. 14A, a program operation PGM_OP based on the first state ordering and a dump operation DMP_OP performed together with the program operation PGM_OP are illustrated.

As described above, one program loop may include the program execution interval PGMEXE and the verification interval VFY, and may further include a verification end interval VFYEND subsequent to the verification interval VFY. The dump operation DMP_OP may include a normal dump operation NDMP and a cache latch dump operation CDMP, and a time required for the cache latch dump operation CDMP may be longer than that of the normal dump operation NDMP.

As illustrated in FIG. 14A, when the program operation PGM_OP based on the first state ordering is performed, the normal dump operation NDMP and the cache latch dump operation CDMP may be performed in the program execution interval PGMEXE, the normal dump operation NDMP may be performed in the verification interval VFY, and the cache latch dump operation CDMP may be performed in the verification end interval VFYEND. The time durations (or time lengths) required for the program execution interval PGMEXE, the verification interval VFY, and the verification end interval VFYEND may be represented by TA, TB, and TC, respectively. Consequently, the total time required for one program loop is may be represented by a sum (addition) of the time durations (e.g., TA+TB+TC). If a total of N program loops are performed, then the total time required for the program operation including N program loops may be represented as N×(TA+TB+TC).

Figure 14B:
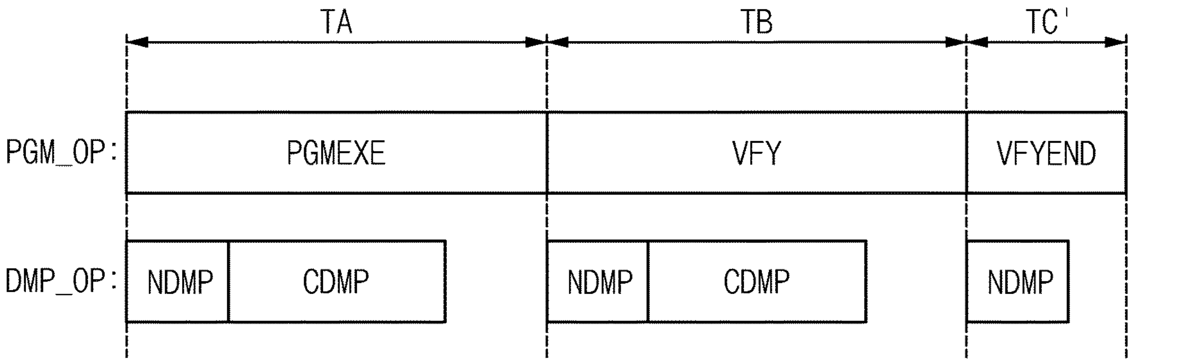

Referring to FIG. 14B, a program operation PGM_OP based on the second state ordering and a dump operation DMP_OP performed together with the program operation PGM_OP are illustrated. The program operation depicted in FIG. 14B may be similar in many respects to the program operation depicted in FIG. 14A, and as such, repeated descriptions of the program operation described above with reference to FIG. 14A may be omitted for the sake of brevity.

As illustrated in FIG. 14B, when the program operation PGM_OP based on the second state ordering is performed, the normal dump operation NDMP and the cache latch dump operation CDMP may be performed in the program execution interval PGMEXE, the normal dump operation NDMP and the cache latch dump operation CDMP may be performed in the verification interval VFY, and the normal dump operation NDMP may be performed in the verification end interval VFYEND. As compared to the example of FIG. 14A, the cache latch dump operation CDMP performed in the verification end interval VFYEND may be moved to the verification interval VFY and the normal dump operation NDMP with a short required time may be additionally performed in the verification end interval VFYEND, in the example of FIG. 14B. For example, the cache latch dump operation CDMP performed in the verification interval VFY of FIG. 14B may be performed together with the bitline precharge operation.

As the normal dump operation NDMP is performed rather than the cache latch dump operation CDMP in the verification end interval VFYEND, a time required for the verification end interval VFYEND may be reduced from TC to TC'. Thus, the total time required for one program loop may be reduced to (TA+TB+TC'). In addition, if a total of N program loops are performed, the total time required for the program operation including N program loops may be reduced to N×(TA+TB+TC').

As described above, the total time required for the program operation PGM_OP based on the second state ordering may be reduced when compared to the total time required for the program operation PGM_OP based on the first state ordering. For example, the total time required for the program operation PGM_OP based on the second state ordering may be reduced from the total time required for the program operation PGM_OP based on the first state ordering, regardless of the total number of data transfers (e.g., the total number of the dump operations DMP_OP) in which data is transferred between the latches 533, 534 and 535 included in the page buffer PB during the program operation PGM_OP (e.g., even if the total number of data transfers during the program operation PGM_OP based on the second state ordering is increased from the total number of data transfers during the program operation PGM_OP based on the first state ordering).

In the method of programming data in the nonvolatile memory device, according to example embodiments, the program speed may be increased and/or improved by swapping or changing the state ordering when a specific latch among the latches 533, 534 and 535 included in the page buffer PB has a data transfer time longer than those of the other latches. For example, the state ordering may be swapped from the default state ordering to the optimized state ordering, the data transfer with a relatively long time (e.g., the cache latch dump operation) may be prevented from occurring in a specific time interval (e.g., the verification end interval VFYEND), and thus the time required for the program operation may be shortened. That is, the time required for the program operation may be shortened even when the total number of data transfers may not be reduced. Thereafter, the state ordering may be re-swapped from the optimized state ordering to the default state ordering.

Figure 15:
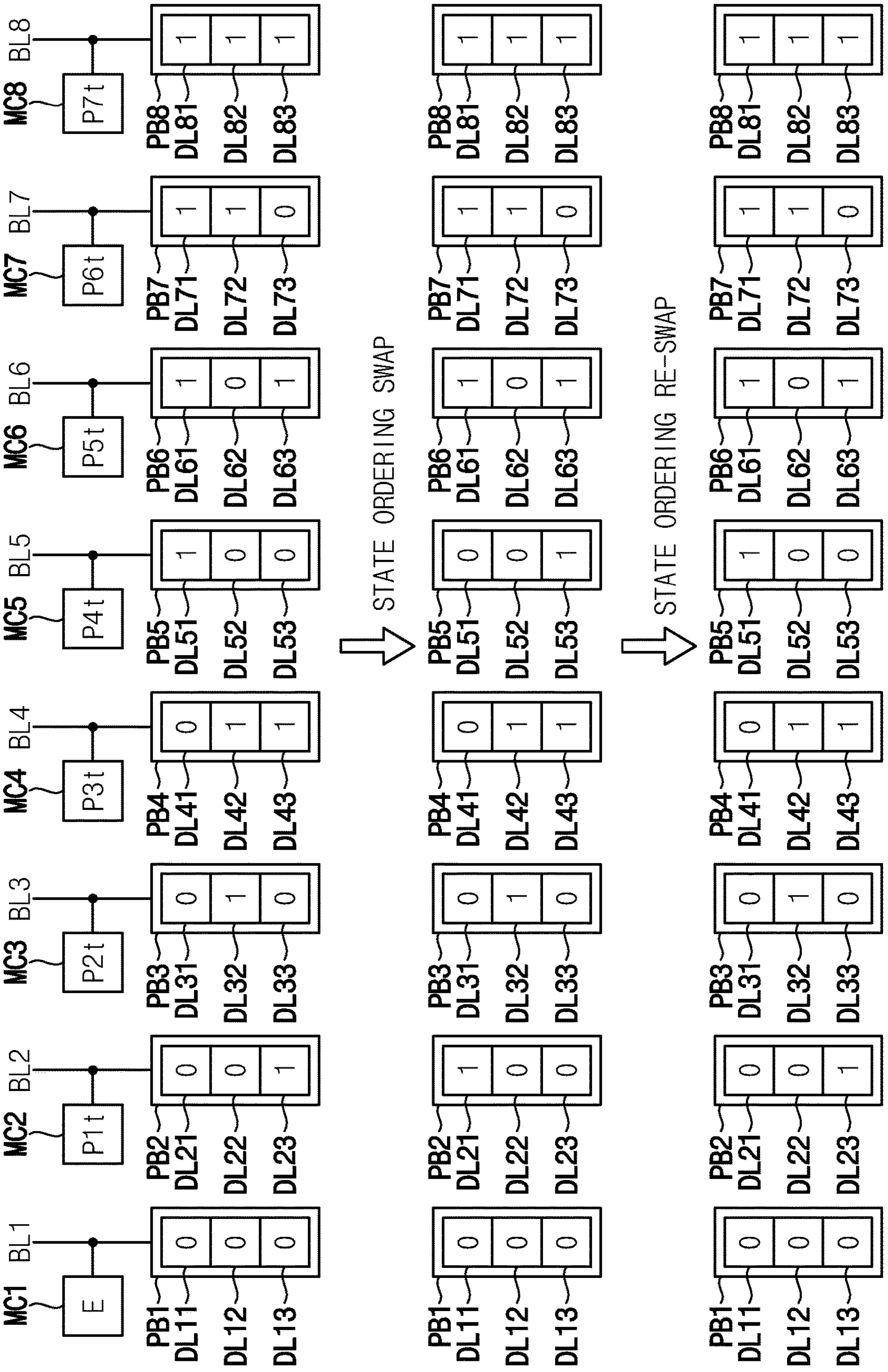

Referring to FIG. 15, an example of changes in data values of state data loaded into a plurality of page buffers when the state ordering is swapped and re-swapped is illustrated.

For convenience of illustration, first to eighth memory cells MC1 to MC8 and first to eighth page buffers PB1 to PB8 are illustrated. The memory cells MC1 to MC8 may be connected to the page buffers PB1 to PB8 through first to eighth bitlines BL1 to BL8, respectively. In addition, the first to eighth page buffers PB1 to PB8 may include data latches (e.g., first data latch DL11, second data latch DL12, third data latch DL13, fourth data latch DL21, fifth data latch DL22, sixth data latch DL23, seventh data latch DL31, eighth data latch DL32, ninth data latch DL33, tenth data latch DL41, eleventh data latch DLA2, twelfth data latch DLA3, thirteenth data latch DL51, fourteenth data latch DL52, fifteenth data latch DL53, sixteenth data latch DL61, seventeenth data latch DL62, eighteenth data latch DL63, nineteenth data latch DL71, twentieth data latch DL72, twenty-first data latch DL73, twenty-second DL81, twenty-third DL82, and twenty-fourth DL83), and one page buffer may include three data latches.

The first to eighth memory cells MC1 to MC8 may be programmed to have the plurality of states E and P1*t* to P7*t*. In an initial operation time, state data corresponding to the first state ordering S_ORD_1*a* may be loaded into the first to eighth page buffers PB1 to PB8. When the state ordering swapping operation is performed, data values loaded into the second and fifth page buffers PB2 and PB5 may be changed to correspond to the second state ordering S_ORD_2*a*. When the state ordering re-swapping operation is performed, data values loaded into the second and fifth page buffers PB2 and PB5 may be changed back to correspond to the first state ordering S_ORD_1*a*.

Figure 16A:
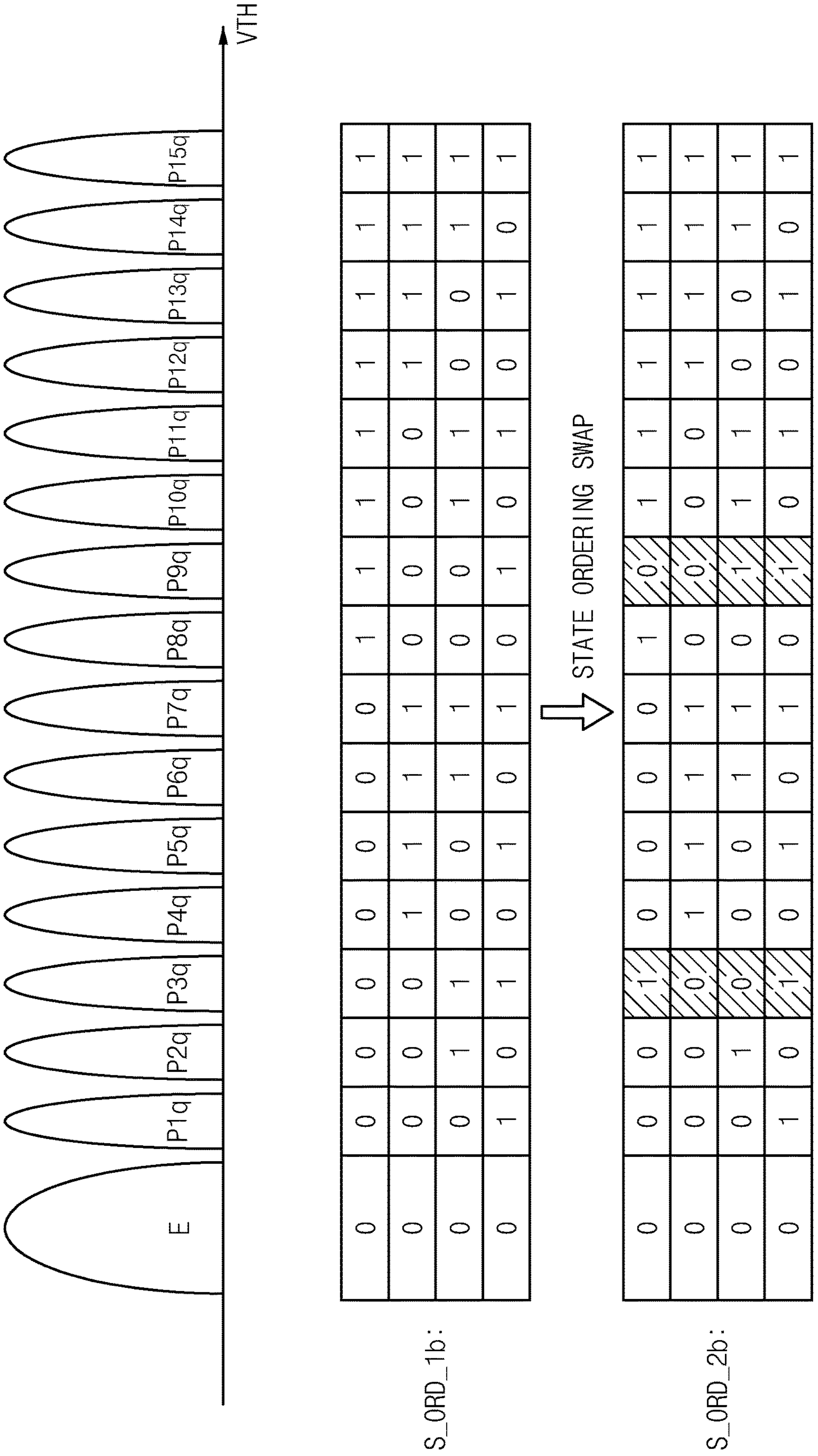
FIGS. 16A and 16B are diagrams for describing an operation of FIG. 9, according to example embodiments.
Figure 16B:
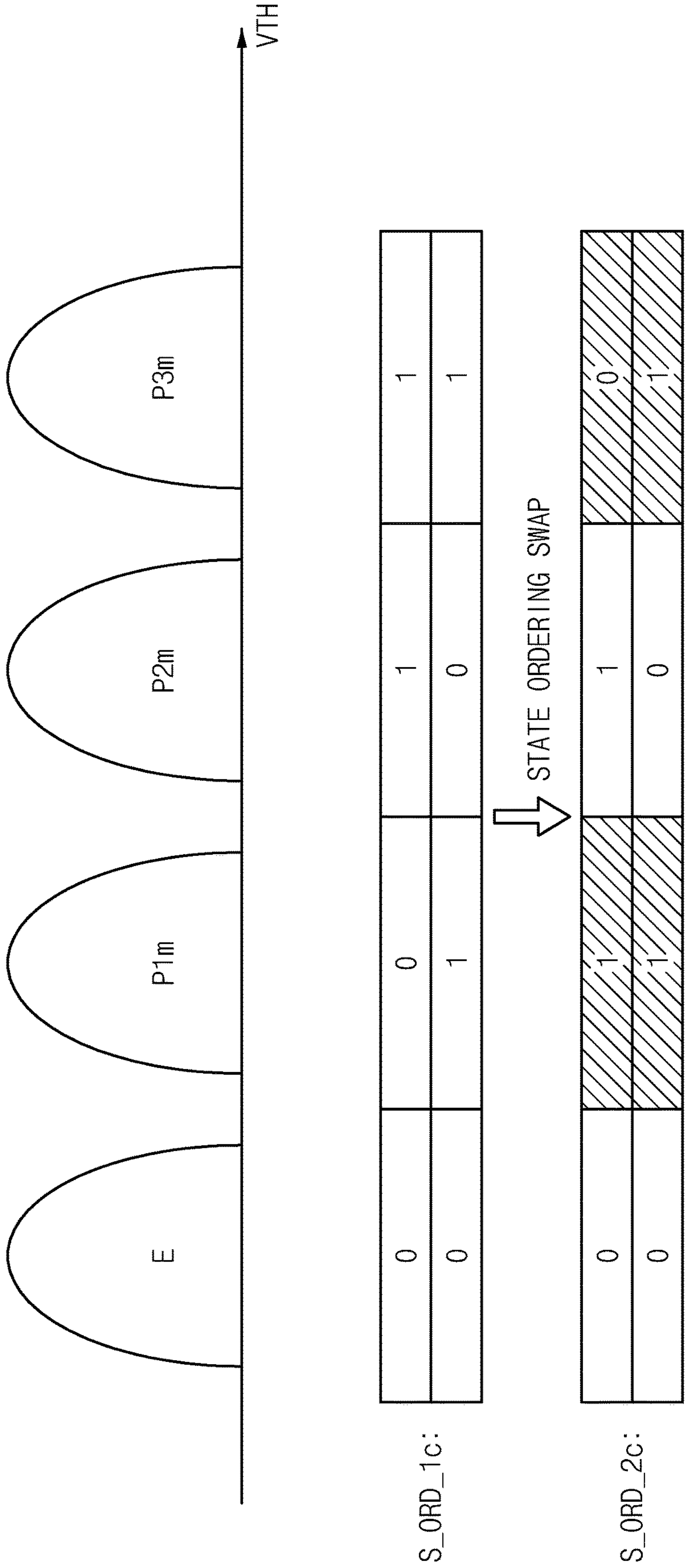

FIGS. 16A and 16B are diagrams for describing an operation of FIG. 9. The examples depicted in FIGS. 16A and 16B may be similar in many respects to the examples depicted in FIGS. 10A and 12A, and as such, repeated descriptions of the examples described above with reference to FIGS. 10A and 12A may be omitted for the sake of brevity.

Referring to FIG. 16A, an example where the state ordering is swapped from a first state ordering S_ORD_1*b* to a second state ordering S_ORD_2*b* in the QLC is illustrated, and an example where the first state in operation S211 of FIG. 9 is the third program state P3*q* is illustrated.

In the first state ordering S_ORD_1*b*, the plurality of states E and P1*q* to P15*q* of QLCs and a plurality of data values '0000', '0001', '0010', '0011', '0100', '0101', '0110', '0111', '1000', '1001', '1010', '1011', '1100', '1101', '1110', and '1111' of 4-bit data may have a relationship as illustrated in FIG. 16A.

When the program operation is performed with respect to the third program state P3*q* (e.g., when the threshold voltages of the target memory cells are lower than the threshold voltage level VL3*q*), the state ordering may be swapped or changed from the first state ordering S_ORD_1*b* to the second state ordering S_ORD_2*b*.

In the second state ordering S_ORD_2*b*, the plurality of states E and P1*q* to P15*q* of QLCs and the plurality of data values '0000' to '1111' of 4-bit data may have a relationship as illustrated in FIG. 16A. For example, the data values '0011' and '1001' corresponding to the third and ninth program states P3*q* and P9*q* may be exchanged with each other.

In some embodiments, the second state in operation S311 of FIG. 11 may be performed with respect to the ninth program state P9*q*. For example, when the program operation is performed with respect to the ninth program state P9*q* (e.g., when the threshold voltages of the target memory cells are close (similar) to the threshold voltage level VL9*q*), the state ordering may be re-swapped and/or changed back from the second state ordering S_ORD_2*b* to the first state ordering S_ORD_1*b*.

Referring to FIG. 16B, an example where the state ordering is swapped from a first state ordering S_ORD_1*c* to a second state ordering S_ORD_2*c* in the MLC is illustrated, and an example where the first state in operation S211 of FIG. 9 is the first program state P1*m* is illustrated.

In the first state ordering S_ORD_1*c*, the plurality of states E and P1*m* to P3*m* of MLCs and a plurality of data values '00', '01', '10', and '11' of 2-bit data may have a relationship as illustrated in FIG. 16B.

When the program operation is performed with respect to the first program state P1*m* (e.g., when the threshold voltages of the target memory cells are lower than the threshold voltage level VL1*m*), the state ordering may be swapped or changed from the first state ordering S_ORD_1*c* to the second state ordering S_ORD_2*c*.

In the second state ordering S_ORD_2*c*, the plurality of states E and P1*m* to P3*m* of MLCs and the plurality of data values '00' to '11' of 2-bit data may have a relationship as illustrated in FIG. 16B. For example, the data values '01' and '11' corresponding to the first and third program states P1*m* and P3*m* may be exchanged with each other.

In some embodiments, the second state in operation S311 of FIG. 11 may be performed with respect to the third program state P3*m*. For example, when the program operation is performed with respect to the third program state P3*m* (e.g., when the threshold voltages of the target memory cells are close (e.g., similar) to the threshold voltage level VL3*m*, the state ordering may be re-swapped or changed back from the second state ordering S_ORD_2*c* to the first state ordering S_ORD_1*c*.

Although example embodiments are described based on specific states, specific data values and specific multi-level cells, example embodiments are not limited thereto.

Figure 17:
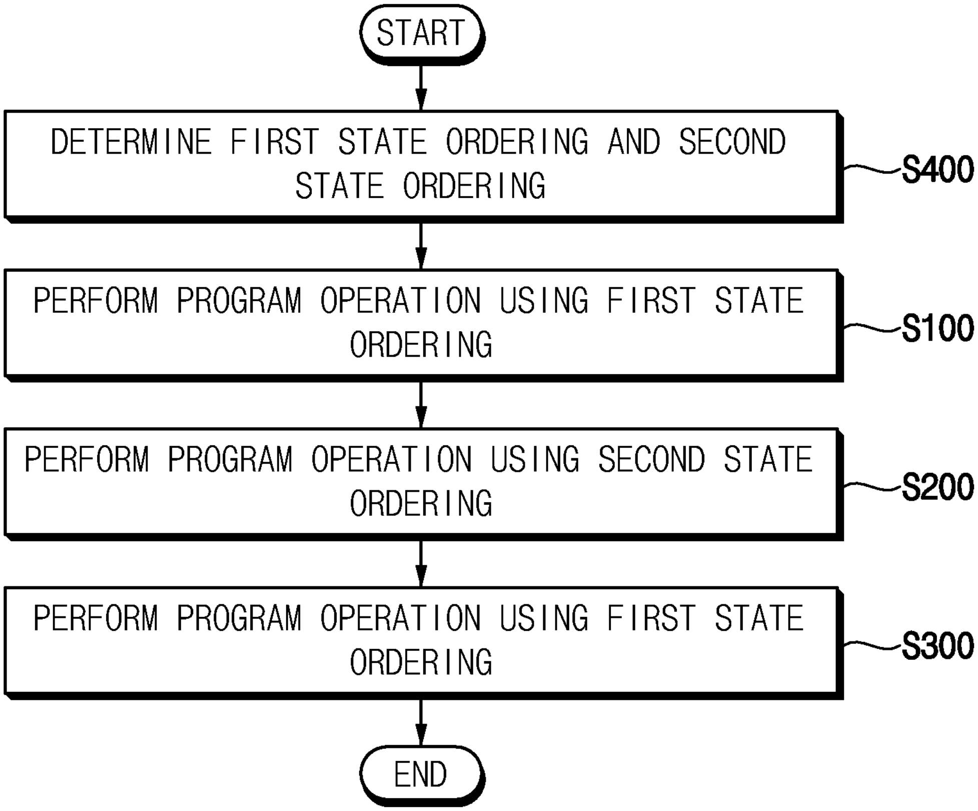
FIGS. 17 and 18 are flowcharts illustrating a method of programming data in a nonvolatile memory device, according to example embodiments.
Figure 18:
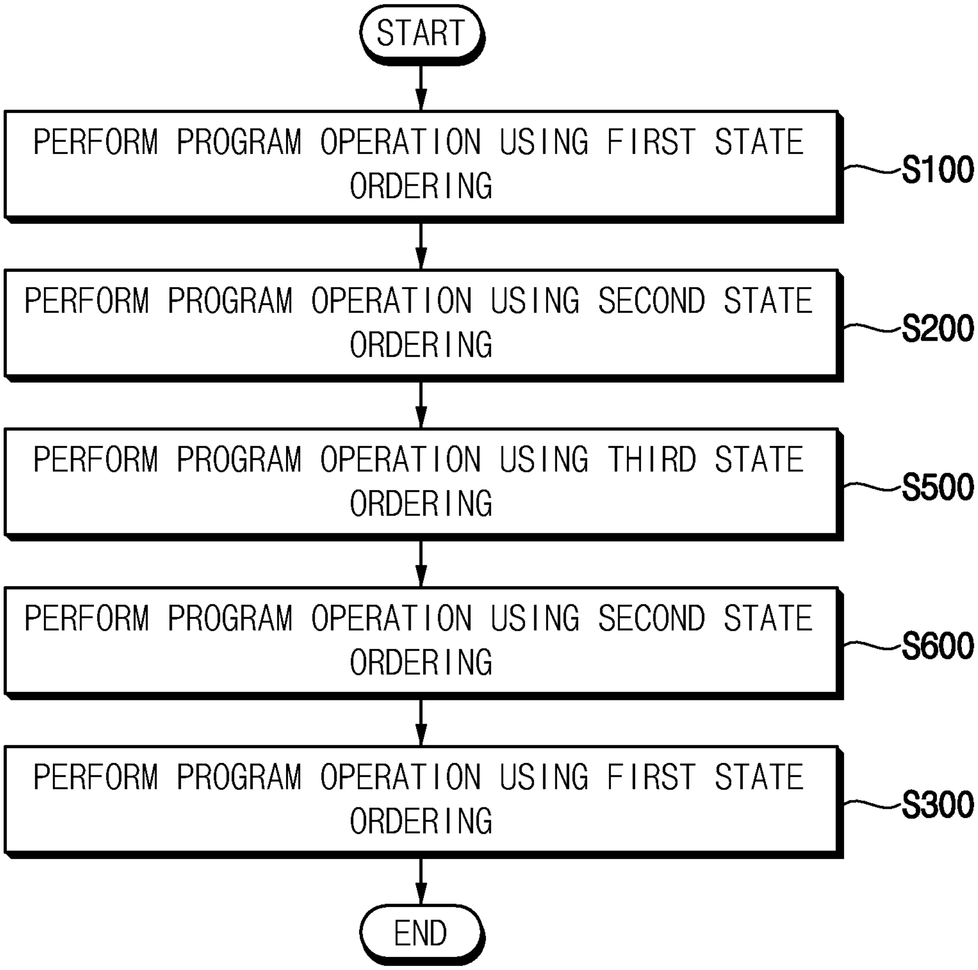

FIGS. 17 and 18 are flowcharts illustrating a method of programming data in a nonvolatile memory device according to example embodiments. The method of programming data depicted in FIGS. 17 and 18 may be similar in many respects to the method depicted in FIG. 1, and as such, repeated descriptions of the method described above with FIG. 1 may be omitted for the sake of brevity.

Referring to FIG. 17, in the method of programming data in the nonvolatile memory device, according to example embodiments, the first state ordering and the second state ordering may be determined (operation S400).

In some example embodiments, the first state ordering and the second state ordering may be determined based on at least one of the total number of data transfers in which data is transferred between the plurality of latches 533, 534 and 535 during the program operation and the total time required for the program operation. For example, as described with reference to FIGS. 14A and 14B, the first state ordering and the second state ordering may be determined such that the total time required for the program operation based on the second state ordering is shorter than the total time required for the program operation based on the first state ordering. As another example, the first state ordering and the second state ordering may be determined such that the total time required for the program operation based on the second state ordering is shorter than the total time required for the program operation based on the first state ordering, even if the total number of data transfers during the program operation based on the second state ordering is greater than the total number of data transfers during the program operation based on the first state ordering.

In some example embodiments, operation S400 may be performed in advance, for example, during the manufacturing and/or design process of the nonvolatile memory device. However, example embodiments are not limited thereto, and operation S400 may be performed in real-time while the nonvolatile memory device is driving, for example, by detecting a change in an operating environment.

Thereafter, operations S100, S200 and S300 of FIG. 17 may include and/or may be similar in many respects to the operations S100, S200 and S300 described above with reference to FIG. 1. Consequently, repeated descriptions of the operations S100, S200 and S300 described above with reference to FIG. 1 may be omitted for the sake of brevity.

Referring to FIG. 18, in the method of programming data in the nonvolatile memory device, according to example embodiments, operations S100, S200, and S300 of FIG. 18 may include and/or may be similar in many respects to the operations S100, S200, and S300 described above with reference to FIG. 1. Consequently, repeated descriptions of the operations S100, S200, and S300 described above with reference to FIG. 1 may be omitted for the sake of brevity.

The program operation may be performed using a third state ordering that is different from the first and second state orderings (operation S500). For example, operation S500 may be similar to operation S200, and an operation of swapping or changing the state ordering may be performed in operation S500. For example, as compared to the relationship between the plurality of states and the plurality of data values in the second state ordering, some (e.g., a portion) or all of the relationships between the plurality of states and the plurality of data values may be changed in the third state ordering.

The program operation is performed using the second state ordering (operation S600). For example, operation S600 may be similar to operation S300, and an operation of re-swapping and/or changing back the state ordering may be performed in operation S600.

Figure 19:
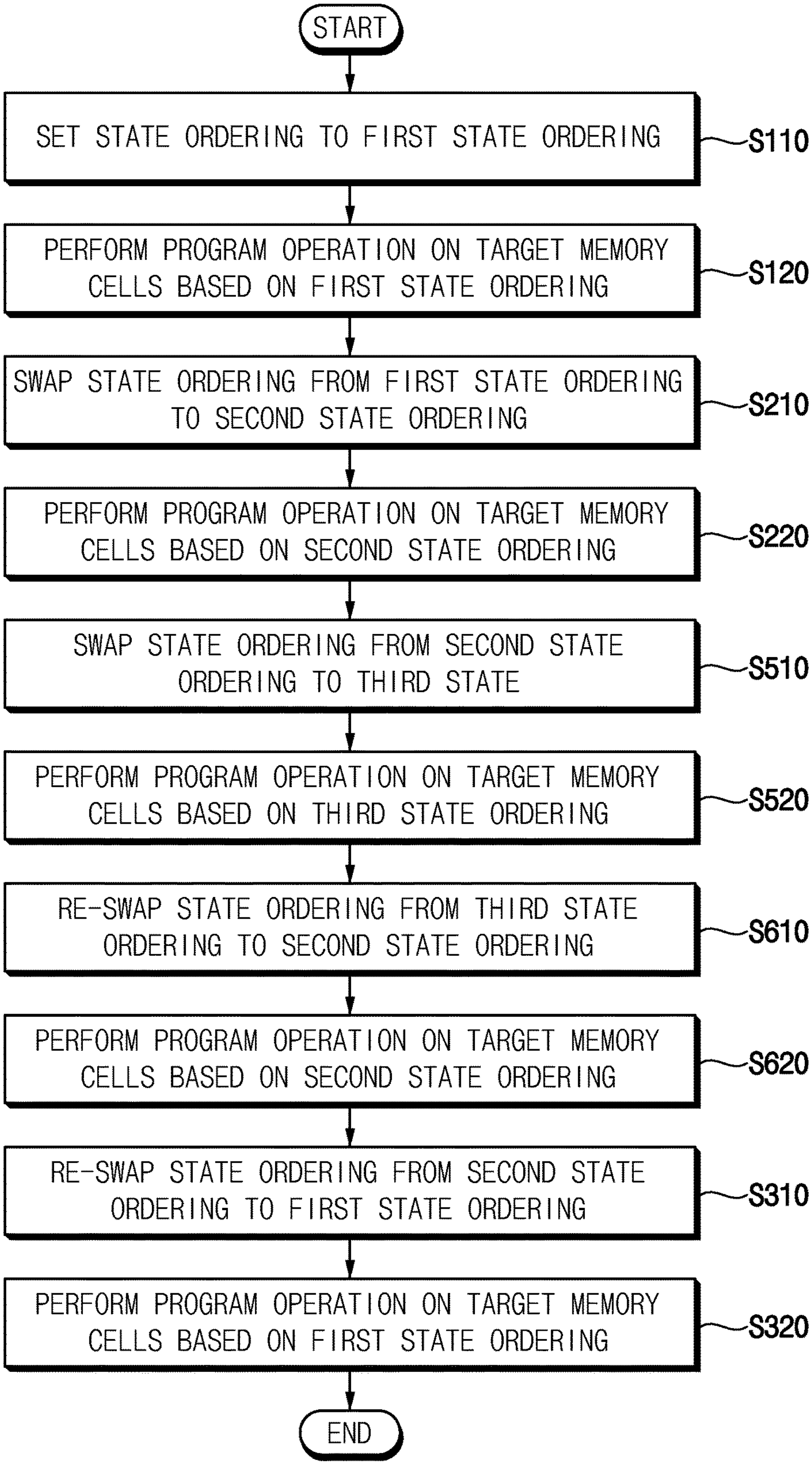
FIG. 19 is a flowchart illustrating an example of a method of programming data in a nonvolatile memory device of FIG. 18, according to example embodiments.

FIG. 19 is a flowchart illustrating an example of a method of programming data in a nonvolatile memory device of FIG. 18.

Referring to FIGS. 18 and 19, operations S110, S120, S210, S220, S310, and S320 of FIGS. 18 and 19 may include and/or may be similar in many respects to the operations S110, S120, S210, S220, S310, and S320 described above with reference to FIG. 2. Consequently, repeated descriptions of the S110, S120, S210, S220, S310, and S320 described above with reference to FIG. 2 may be omitted for the sake of brevity.

The state ordering may be swapped from the second state ordering to the third state ordering (operation S510), and the program operation may be performed on the target memory cells based on the third state ordering (operation S520). Operations S510 and S520 may be similar to operations S210 and S220, respectively. For example, as described with reference to FIG. 9, when it is checked that the program operation is performed with respect to a specific state (e.g., a third state) in operation S510, the state ordering may be set to the third state ordering.

The state ordering may be re-swapped from the third state ordering to the second state ordering (operation S610), and the program operation may be performed on the target memory cells based on the second state ordering (operation S620). Operations S610 and S620 may be similar to operations S310 and S320, respectively. For example, as described with reference to FIG. 11, when it is checked that the program operation is performed with respect to another specific state (e.g., a fourth state) in operation S610, the state ordering may be set to the second state ordering.

In some example embodiments, when operation S210 is performed during the program execution interval of the first program loop and operation S310 is performed during the verification interval of the K-th program loop subsequent to the first program loop, operation S510 may be performed during a program execution interval of a P-th program loop, and operation S610 may be performed in a verification interval of a Q-th program loop subsequent to the P-th program loop, where P and Q is positive integers greater than zero (0) and smaller (less) than or equal to N. For example, the P-th and Q-th program loops may be program loops between the first and K program loops (e.g., 1<P<Q<K).

FIGS. 20A, 20B, 21A, and 21B are diagrams for describing an operation of FIG. 19, according to example embodiments.

Figure 20A:
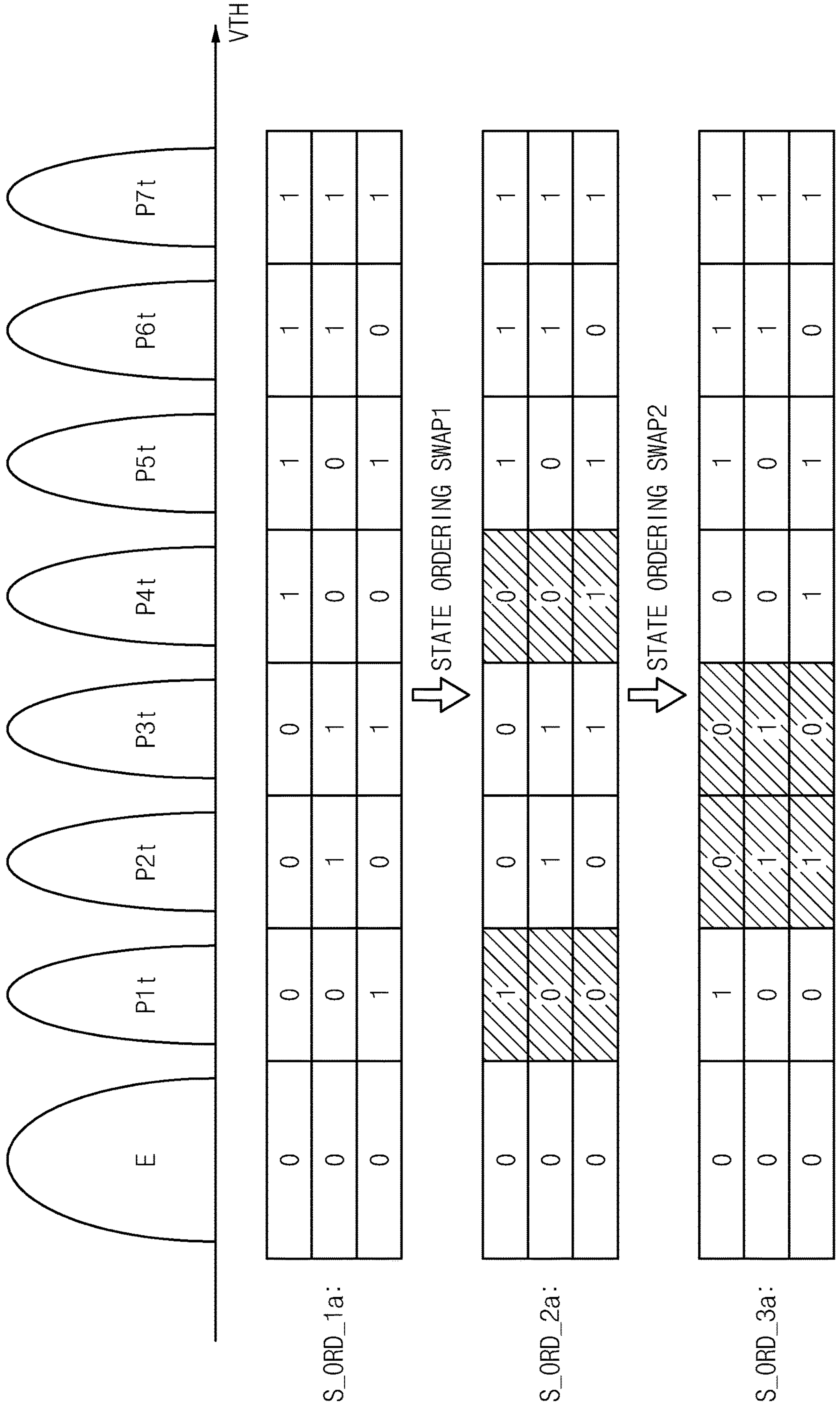
FIGS. 20A, 20B, 21A and 21B are diagrams for describing an operation of FIG. 19, according to example embodiments.

Referring to FIG. 20A, an example where the state ordering is swapped from the first state ordering S_ORD_1*a* to the second state ordering S_ORD_2*a* and from the second state ordering S_ORD_2*a* to a third state ordering S_ORD_3*a* in the TLC is illustrated. The operation of swapping the state ordering from the first state ordering S_ORD_1*a* to the second state ordering S_ORD_2*a* may be similar in many respects to the examples depicted in FIG. 10A, and as such, repeated descriptions of the examples described above with reference to FIG. 10A may be omitted for the sake of brevity.

When the program operation is performed with respect to the second program state P2*t* (e.g., when the threshold voltages of the target memory cells are lower than the threshold voltage level VL2*t*), the state ordering may be swapped or changed from the second state ordering S_ORD_2*a* to the third state ordering S_ORD_3*a*.

In the third state ordering S_ORD_3*a*, the plurality of states E and P1*t* to P7*t* of TLCs and the plurality of data values '000' to '111' of 3-bit data may have a third relationship that may be different from the first and second relationships. For example, in the third state ordering S_ORD_3*a*, the data values '010' and '011' corresponding to the second and third program states P2*t* and P3*t* may be exchanged with each other.

Figure 20B:
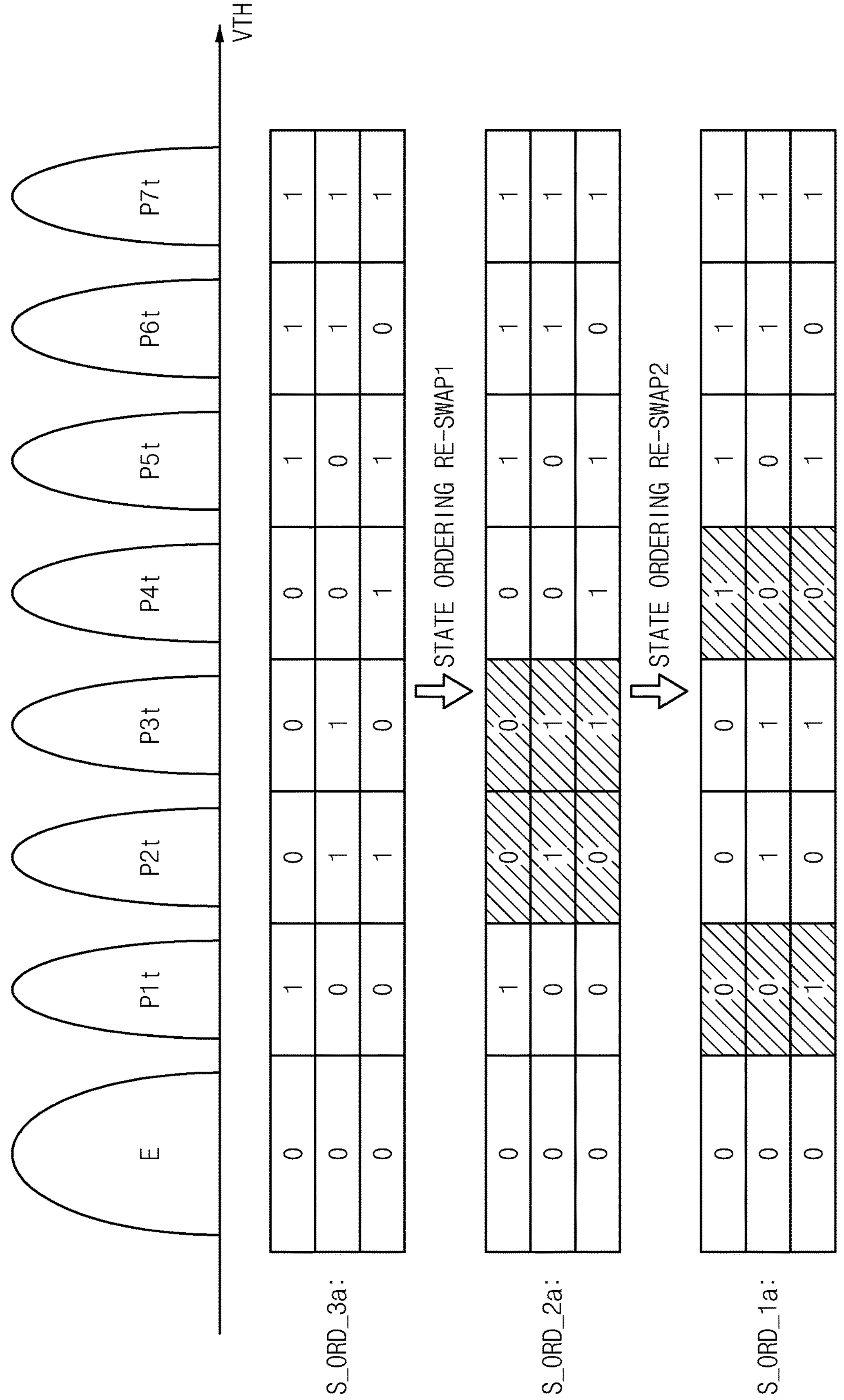

Referring to FIG. 20B, an example where the state ordering is re-swapped from the third state ordering S_ORD_3*a* to the second state ordering S_ORD_2*a* and from the second state ordering S_ORD_2*a* to the first state ordering S_ORD_1*a* in the TLC is illustrated. The operation of re-swapping the state ordering from the second state ordering S_ORD_2*a* to the first state ordering S_ORD_1*a* may be similar in many respects to the examples depicted in FIG. 12A, and as such, repeated descriptions of the examples described above with reference to FIG. 12A may be omitted for the sake of brevity.

When the program operation is performed with respect to the third program state P3*t* (e.g., when the threshold voltages of the target memory cells are close to the threshold voltage level VL3*t*), the state ordering may be re-swapped or changed back from the third state ordering S_ORD_3*a* to the second state ordering S_ORD_2*a*.

Figure 21A:
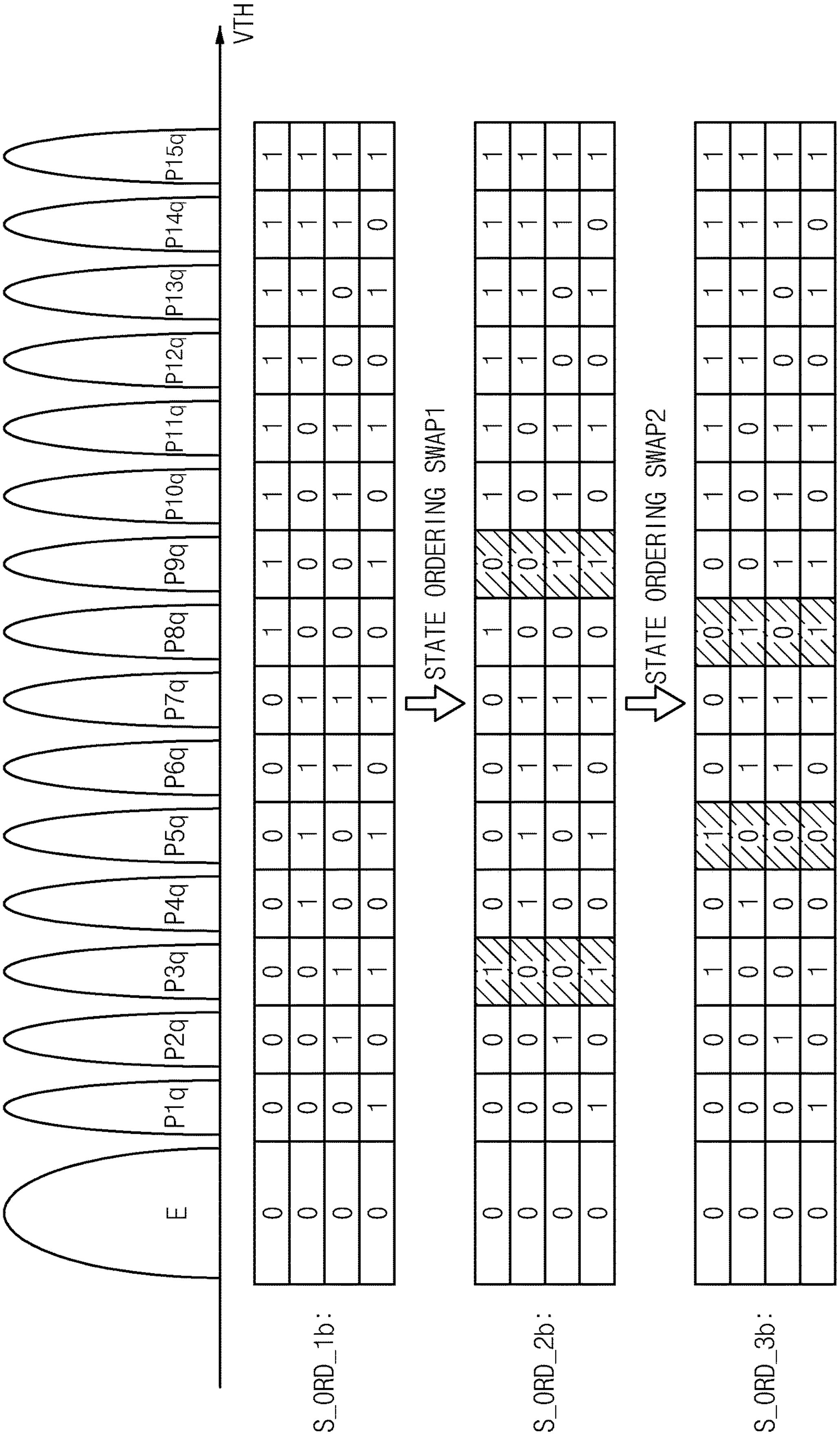

Referring to FIG. 21A, an example where the state ordering is swapped from the first state ordering S_ORD_1*b* to the second state ordering S_ORD_2*b* and from the second state ordering S_ORD_2*b* to a third state ordering S_ORD_3*b* in the QLC is illustrated. The operation of swapping the state ordering from the first state ordering S_ORD_1*b* to the second state ordering S_ORD_2*b* may be similar in many respects to the examples depicted in FIG. 16A, and as such, repeated descriptions of the examples described above with reference to FIG. 16A may be omitted for the sake of brevity.

When the program operation is performed with respect to the fifth program state P5*q* (e.g., when the threshold voltages of the target memory cells are lower than the threshold voltage level VL5*q*), the state ordering may be swapped or changed from the second state ordering S_ORD_2*b* to the third state ordering S_ORD_3*b*.

In the third state ordering S_ORD_3*b*, the plurality of states E and P1*q* to P15*q* of QLCs and the plurality of data values '0000' to '1111' of 4-bit data may have a relationship as illustrated in FIG. 21A. For example, the data values '0101' and '1000' corresponding to the fifth and eighth program states P5*q* and P8*q* may be exchanged with each other.

Figure 21B:
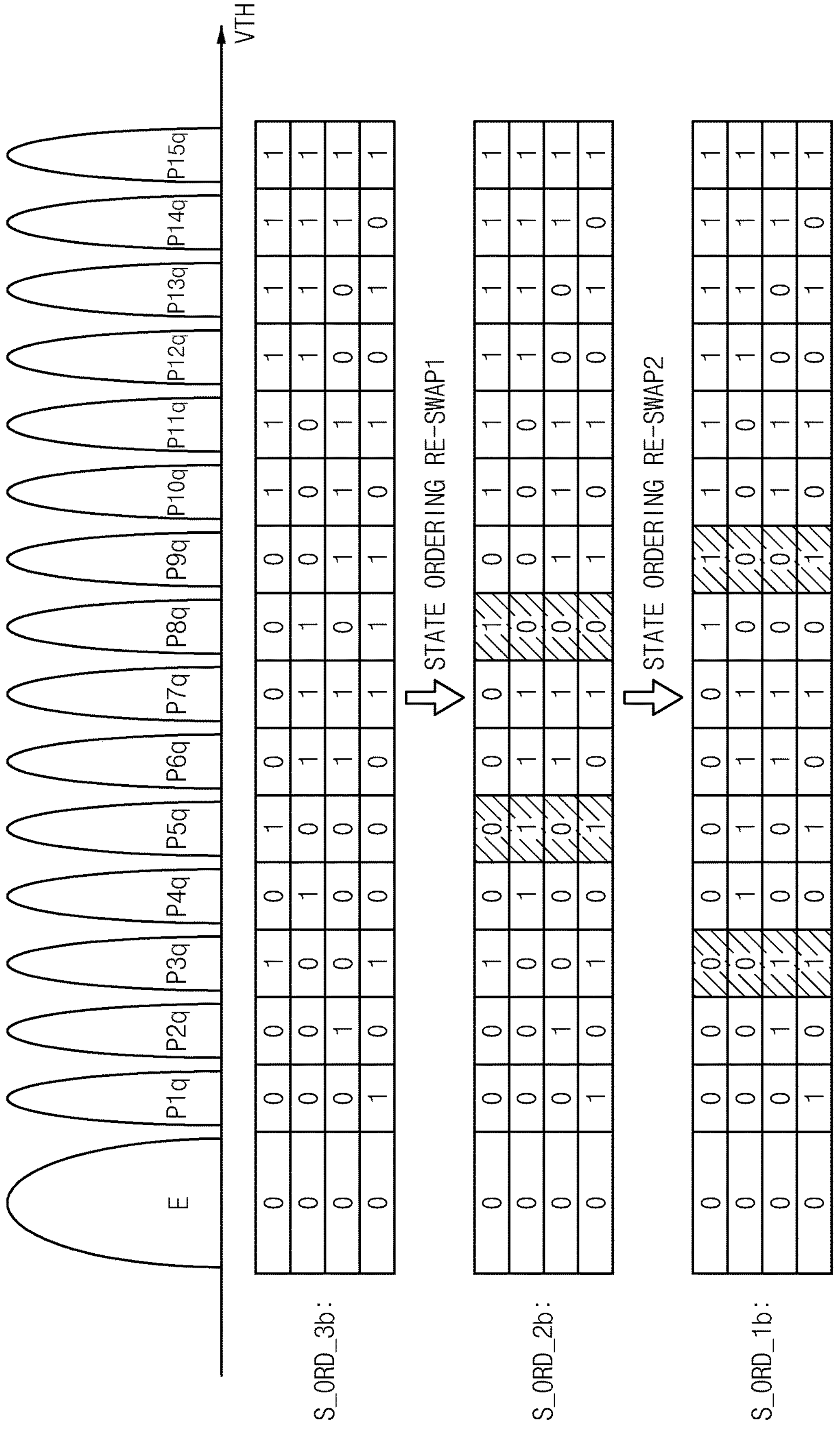

Referring to FIG. 21B, an example where the state ordering is re-swapped from the third state ordering S_ORD_3*b* to the second state ordering S_ORD_2*b* and from the second state ordering S_ORD_2*b* to the first state ordering S_ORD_1*b* in the QLC is illustrated.

When the program operation is performed with respect to the eighth program state P8*q* (e.g., when the threshold voltages of the target memory cells are close to the threshold voltage level VL8*q*), the state ordering may be re-swapped or changed back from the third state ordering S_ORD_3*b* to the second state ordering S_ORD_2*b*.

When the program operation is performed with respect to the ninth program state P9*q* (e.g., when the threshold voltages of the target memory cells are close to the threshold voltage level VL9*q*), the state ordering may be re-swapped or changed back from the second state ordering S_ORD_2*b* to the first state ordering S_ORD_1*b*.

Although example embodiments are described based on specific states, specific data values, and specific multi-level cells, example embodiments are not limited thereto.

Although example embodiments are described based on examples where the state ordering swapping operation is performed once or twice and then the state ordering re-swapping operation is performed once or twice, example embodiments are not limited thereto, and the state ordering swapping operation and the state ordering re-swapping operation may be performed three or more times.

FIG. 22 is a block diagram illustrating a memory system including a nonvolatile memory device, according to example embodiments.

Referring to FIG. 22, a memory system 10 may include a memory controller 20 and a nonvolatile memory device 50.

The nonvolatile memory device 50 may perform data erase, write (or program) and/or read operations under control of the memory controller 20. The nonvolatile memory device 50 may receive a command CMD and an address ADDR through input/output (I/O) lines from the memory controller 20 for performing such data erase, write and/or read operations, and may exchange data DAT with the memory controller 20 for performing such data write and/or read operations. Alternatively or additionally, the nonvolatile memory device 50 may receive a control signal CTRL through a control line from the memory controller 20. In some embodiments, the nonvolatile memory device 50 may receive power PWR through a power line from the memory controller 20.

The nonvolatile memory device 50 may be the nonvolatile memory device according to example embodiments, may include a state ordering controller 60, and may perform the method of programming data according to example embodiments.

As used herein, in some example embodiments, at least a part (portion) or all of the signal lines may be referred to as a channel. For example, the term "channel" may represent signal lines that may include the data I/O lines for transmitting the data DAT, command lines for transmitting the command CMD, and address lines for transmitting the address ADDR.

Figure 23:
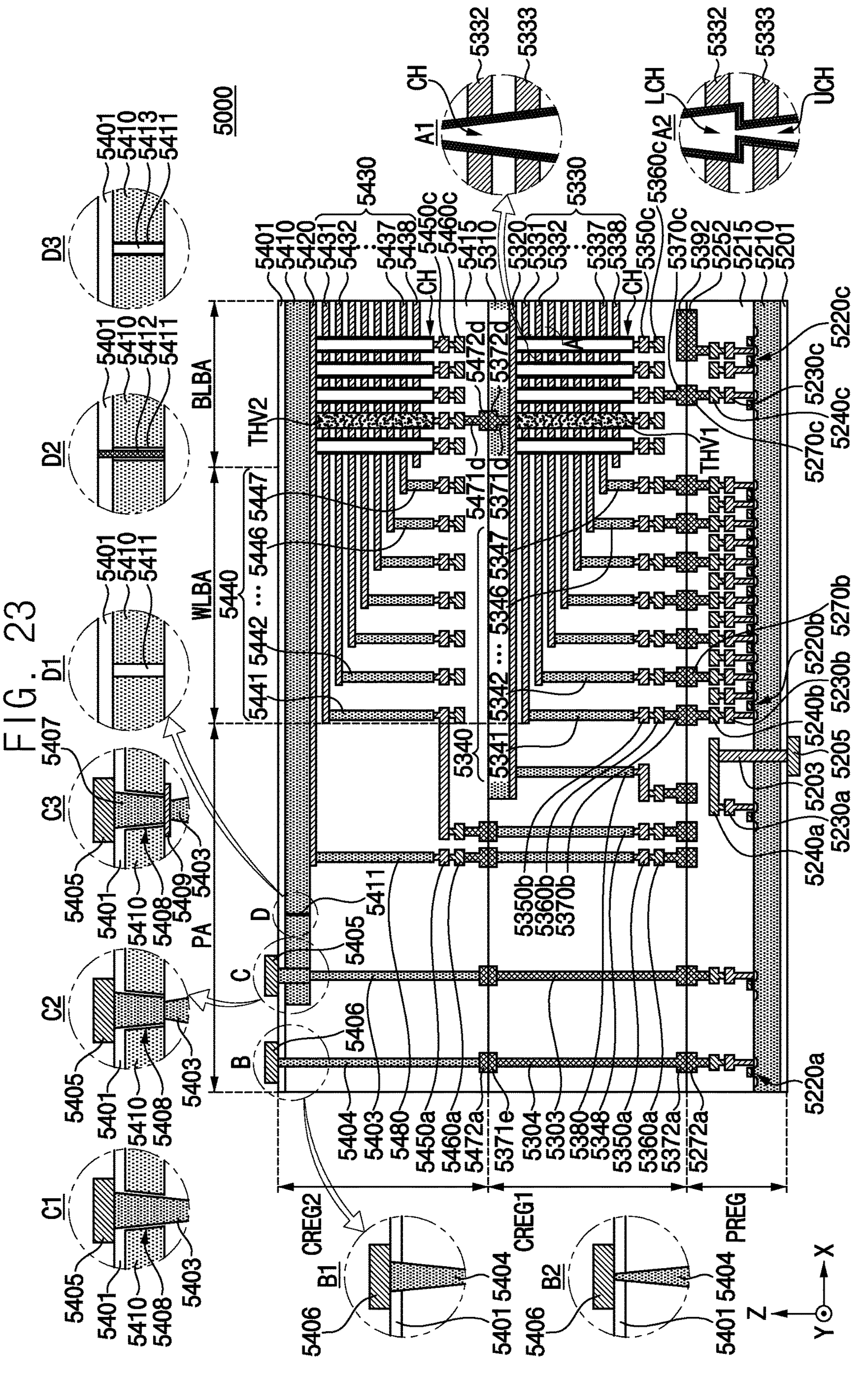
FIG. 23 is a cross-sectional view of a memory device, according to example embodiments.

FIG. 23 is a cross-sectional view of a memory device, according to example embodiments.

Referring to FIG. 23, a memory device (or nonvolatile memory device) 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may refer to a method of electrically and/or physically connecting a bonding metal pattern formed in an uppermost metal layer of the upper chip to a bonding metal pattern formed in an uppermost metal layer of the lower chip. As another example, in a case in which the bonding metal patterns are formed of copper (Cu), the bonding method may be referred to as a Cu—Cu bonding method. Alternatively or additionally, the bonding metal patterns may be formed of other materials, such as, but not limited to, aluminum (Al) or tungsten (W).

The memory device 5000 may include the at least one upper chip including the cell region. For example, as illustrated in FIG. 23, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2, and the lower chip including the peripheral circuit region PREG may be manufactured separately, and then, the first upper chip, the second upper chip, and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips may be referred to based on their respective orientations before each of the first and second upper chips is turned over. For example, an upper portion of the lower chip may refer to an upper portion defined based on a +Z-axis direction, and the upper portion of each of the first and second upper chips may refer to an upper portion defined based on a −Z-axis direction in FIG. 23. However, example embodiments are not limited thereto. In some example embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a wordline bonding region WLBA, and a bitline bonding region BLBA.

The peripheral circuit region PREG may include a first substrate 5210 and a plurality of circuit elements (e.g., first circuit element 5220*a*, second circuit element 5220*b*, and third circuit element 5220*c*) formed on the first substrate 5210. An interlayer insulating layer 5215 including one or more insulating layers may be provided on the plurality of circuit elements 5220*a* to 5220*c*, and a plurality of metal lines electrically connected (e.g., coupled) to the plurality of circuit elements 5220*a* to 5220*c* may be provided in the interlayer insulating layer 5215. For example, the plurality of metal lines may include first metal lines (e.g., first metal line 5230*a*, second metal line 5230*b*, and third metal line 5230*c*) connected to the plurality of circuit elements 5220*a* to 5220*c*, and second metal lines (e.g., fourth metal line 5240*a*, fifth metal line 5240*b*, and sixth metal line 5240*c*) formed on the first metal lines 5230*a* to 5230*c*. The plurality of metal lines may be formed of at least one of various conductive materials. For example, the first metal lines

5230*a* to 5230*c* may be formed of tungsten (W) having a relatively high electrical resistivity, and the second metal lines 5240*a* to 5240*c* may be formed of copper (Cu) having a relatively low electrical resistivity.

The first metal lines 5230*a* to 5230*c* and the second metal lines 5240*a* to 5240*c* are illustrated and described in some example embodiments. However, example embodiments are not limited thereto. In some example embodiments, at least one or more additional metal lines may further be formed on the second metal lines 5240*a* to 5240*c*. In such embodiments, the second metal lines 5240*a* to 5240*c* may be formed of aluminum (Al), and at least some of the additional metal lines formed on the second metal lines 5240*a* to 5240*c* may be formed of copper (Cu) having an electrical resistivity lower than that of the aluminum (Al) of the second metal lines 5240*a* to 5240*c*.

The interlayer insulating layer 5215 may be disposed on the first substrate 5210 and may include an insulating material such as, but not limited to, silicon oxide (SiO) and/or silicon nitride (SiN).

Each of the first and second cell regions CREG1 and CREG2 may include at least one memory block. The first cell region CREG1 may include a second substrate 5310 and a common source line 5320. A plurality of wordlines 5330 (e.g., first wordline 5331, second wordline 5332, third wordline 5333, fourth wordline 5334, fifth wordline 5335, sixth wordline 5336, seventh wordline 5337, and eighth wordline 5338) may be stacked on the second substrate 5310 in a direction (e.g., the Z-axis direction) perpendicular to a top surface of the second substrate 5310. String selection lines and a ground selection line may be disposed on and under the plurality of wordlines 5330, and the plurality of wordlines 5330 may be disposed between the string selection lines and the ground selection line. Similarly, the second cell region CREG2 may include a third substrate 5410 and a common source line 5420, and a plurality of wordlines 5430 (e.g., first wordline 5431, second wordline 5432, third wordline 5433, fourth wordline 5434, fifth wordline 5435, sixth wordline 5436, seventh wordline 5437, and eighth wordline 5438) may be stacked on the third substrate 5410 in a direction (e.g., the Z-axis direction) perpendicular to a top surface of the third substrate 5410. Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some example embodiments, as illustrated in a region 'A1', the channel structure CH may be provided in the bitline bonding region BLBA and may extend in the direction perpendicular to the top surface of the second substrate 5310 to at least partially penetrate the wordlines 5330, the string selection lines, and the ground selection line. The channel structure CH may include a data storage layer, a channel layer, and a filling insulation layer. The channel layer may be electrically connected (e.g., coupled) to a first metal line 5350*c* and a second metal line 5360*c* in the bitline bonding region BLBA. For example, the second metal line 5360*c* may be a bitline and may be connected to the channel structure CH through the first metal line 5350*c*. The bitline 5360*c* may extend in a first direction (e.g., a Y-axis direction) parallel to the top surface of the second substrate 5310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to at least partially penetrate the common source line 5320 and lower wordlines 5331 and 5332. The lower channel LCH may include a data storage layer, a channel layer, and a filling insulation layer and may be connected to the upper channel UCH. The upper channel UCH may at least partially penetrate upper wordlines 5333 to 5338. The upper channel UCH may include a data storage layer, a channel layer, and a filling insulation layer, and the channel layer of the upper channel UCH may be electrically connected to the first metal line 5350*c* and the second metal line 5360*c*. As a length of a channel increases, due to characteristics of manufacturing processes, it may be difficult to form a channel having a substantially uniform width. The memory device 5000, according to some example embodiments, may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a wordline located near to a boundary between the lower channel LCH and the upper channel UCH may be a dummy wordline. For example, the wordlines 5332 and 5333 adjacent to the boundary between the lower channel LCH and the upper channel UCH may be the dummy wordlines. In such an example, data may not be stored in memory cells connected to the dummy wordline. Alternatively or additionally, the number of pages corresponding to the memory cells connected to the dummy wordline may be less than the number of pages corresponding to the memory cells connected to a general wordline. A level of a voltage applied to the dummy wordline may be different from a level of a voltage applied to the general wordline, and thus, it may be possible to reduce an influence of a non-uniform channel width between the lower and upper channels LCH and UCH on an operation of the memory device.

In some example embodiments, the number of the lower wordlines 5331 and 5332 at least partially penetrated by the lower channel LCH may be less than the number of the upper wordlines 5333 to 5338 at least partially penetrated by the upper channel UCH in the region 'A2'. However, example embodiments are not limited thereto. In some example embodiments, the number of the lower wordlines at least partially penetrated by the lower channel LCH may be greater than or equal to the number of the upper wordlines at least partially penetrated by the upper channel UCH. Alternatively or additionally, structural features and connection relation of the channel structure CH disposed in the second cell region CREG2 may be substantially the same as those of the channel structure CH disposed in the first cell region CREG1.

In the bitline bonding region BLBA, a first through-electrode THV1 may be provided in the first cell region CREG1, and a second through-electrode THV2 may be provided in the second cell region CREG2. As illustrated in FIG. 23, the first through-electrode THV1 may at least partially penetrate the common source line 5320 and the plurality of wordlines 5330. In some example embodiments, the first through-electrode THV1 may further penetrate the second substrate 5310. The first through-electrode THV1 may include a conductive material. Alternatively or additionally, the first through-electrode THV1 may include a conductive material surrounded by an insulating material. The second through-electrode THV2 may have the same and/or a substantially similar shape and structure as the first through-electrode THV1.

In some example embodiments, the first through-electrode THV1 and the second through-electrode THV2 may be electrically connected (e.g., coupled) to each other through a first through-metal pattern 5372*d* and a second through-metal pattern 5472*d*. The first through-metal pattern 5372*d* may be formed at a bottom end of the first upper chip including the first cell region CREG1, and the second through-metal pattern 5472*d* may be formed at a top end of the second upper chip including the second cell region CREG2. The first through-electrode THV1 may be electrically connected (e.g., coupled) to the first metal line 5350*c* and the second metal line 5360*c*. A lower via 5371*d* may be formed between the first through-electrode THV1 and the first through-metal pattern 5372*d*, and an upper via 5471*d* may be formed between the second through-electrode THV2 and the second through-metal pattern 5472*d*. The first through-metal pattern 5372*d* and the second through-metal pattern 5472*d* may be connected (e.g., coupled) to each other by the bonding method.

In the bitline bonding region BLBA, an upper metal pattern 5252 may be formed in an uppermost metal layer of the peripheral circuit region PERI, and an upper metal pattern 5392 having the same and/or a substantially similar shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected (e.g., coupled) to each other by the bonding method. In the bitline bonding region BLBA, the bitline 5360*c* may be electrically connected (e.g., coupled) to a page buffer included in the peripheral circuit region PERI. For example, some of the circuit elements 5220*c* of the peripheral circuit region PREG may constitute the page buffer, and the bitline 5360*c* may be electrically connected (e.g., coupled) to the circuit elements 5220*c* constituting the page buffer through an upper bonding metal pattern 5370*c* of the first cell region CREG1 and an upper bonding metal pattern 5270*c* of the peripheral circuit region PERI.

Continuing to refer to FIG. 23, in the wordline bonding region WLBA, the wordlines 5330 of the first cell region CREG1 may extend in a second direction (e.g., an X-axis direction) parallel to the top surface of the second substrate 5310 and may be connected to a plurality of cell contact plugs 5340 (e.g., first cell contact plug 5341, second cell contact plug 5342, third cell contact plug 5343, fourth cell contact plug 5344, fifth cell contact plug 5345, sixth cell contact plug 5346, and seventh cell contact plug 5347). First metal lines 5350*b* and second metal lines 5360*b* may be sequentially connected (e.g., coupled) onto the cell contact plugs 5340 connected to the plurality of wordlines 5330. In the wordline bonding region WLBA, the cell contact plugs 5340 may be connected (e.g., coupled) to the peripheral circuit region PREG through upper bonding metal patterns 5370*b* of the first cell region CREG1 and upper bonding metal patterns 5270*b* of the peripheral circuit region PERI.

The cell contact plugs 5340 may be electrically connected (e.g., coupled) to a row decoder included in the peripheral circuit region PERI. For example, some of the circuit elements 5220*b* of the peripheral circuit region PREG may constitute the row decoder, and the cell contact plugs 5340 may be electrically connected (e.g., coupled) to the circuit elements 5220*b* constituting the row decoder through the upper bonding metal patterns 5370*b* of the first cell region CREG1 and the upper bonding metal patterns 5270*b* of the peripheral circuit region PERI. In some example embodiments, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Similarly, in the wordline bonding region WLBA, the wordlines 5430 of the second cell region CREG2 may extend in the second direction (e.g., the X-axis direction) parallel to the top surface of the third substrate 5410 and may be connected to a plurality of cell contact plugs 5440 (e.g., first cell contact plug 5441, second cell contact plug 5442, third cell contact plug 5443, fourth cell contact plug 5444, fifth cell contact plug 5445, sixth cell contact plug 5446, and seventh cell contact plug 5447). The plurality of cell contact plugs 5440 may be connected (e.g., coupled) to the peripheral circuit region PREG through an upper metal pattern of the second cell region CREG2 and lower and upper metal patterns and an eighth cell contact plug 5348 of the first cell region CREG1.

In the wordline bonding region WLBA, the upper bonding metal patterns 5370*b* may be formed in the first cell region CREG1, and the upper bonding metal patterns 5270*b* may be formed in the peripheral circuit region PERI. The upper bonding metal patterns 5370*b* of the first cell region CREG1 and the upper bonding metal patterns 5270*b* of the peripheral circuit region PREG may be electrically connected (e.g., coupled) to each other by the bonding method. The upper bonding metal patterns 5370*b* and the upper bonding metal patterns 5270*b* may be formed of aluminum (Al), copper (Cu), or tungsten (W).

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other by the bonding method in the external pad bonding region PA. Similarly, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as, but not limited to, a metal, a metal compound, and/or doped polysilicon. The common source line contact plug 5380 of the first cell region CREG1 may be electrically connected (e.g., coupled) to the common source line 5320, and the common source line contact plug 5480 of the second cell region CREG2 may be electrically connected (e.g., coupled) to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output (I/O) pads (e.g., first I/O pad 5205, second I/O pad 5405, and third I/O pad 5406) may be disposed in the external pad bonding region PA. Referring to FIG. 23, a lower insulating layer 5201 may cover a bottom surface of the first substrate 5210, and the first I/O pad 5205 may be formed on the lower insulating layer 5201. The first I/O pad 5205 may be connected to at least one of a plurality of the circuit elements 5220*a* disposed in the peripheral circuit region PREG through a first I/O contact plug 5203 and may be separated from the first substrate 5210 by the lower insulating layer 5201. In addition, a side insulating layer may be disposed between the first I/O contact plug 5203 and the first substrate 5210 to electrically isolate the first I/O contact plug 5203 from the first substrate 5210.

An upper insulating layer 5401 covering a top surface of the third substrate 5410 may be formed on the third substrate 5410. A second I/O pad 5405 and/or a third I/O pad 5406 may be disposed on the upper insulating layer 5401. The second I/O pad 5405 may be connected to at least one of the plurality of circuit elements 5220*a* disposed in the peripheral circuit region PREG through second I/O contact plugs 5403 and 5303, and the third I/O pad 5406 may be connected to at least one of the plurality of circuit elements 5220*a* disposed in the peripheral circuit region PREG through third I/O contact plugs 5404 and 5304.

In some example embodiments, the third substrate 5410 may not be disposed in a region in which the I/O contact plug is disposed. For example, as illustrated in a region 'B', the third I/O contact plug 5404 may be separated from the third substrate 5410 in a direction parallel to the top surface of the third substrate 5410 and may at least partially penetrate an interlayer insulating layer 5415 of the second cell region CREG2 so as to be connected to the third I/O pad 5406. In such an example, the third I/O contact plug 5404 may be formed by at least one of various processes.

In some example embodiments, as illustrated in a region 'B1', the third I/O contact plug 5404 may extend in a third direction (e.g., the Z-axis direction), and a diameter of the third I/O contact plug 5404 may become progressively greater toward the upper insulating layer 5401. That is, a diameter of the channel structure CH described in the region 'A1' may become progressively less toward the upper insulating layer 5401, but the diameter of the third I/O contact plug 5404 may become progressively greater toward the upper insulating layer 5401. For example, the third I/O contact plug 5404 may be formed after the second cell region CREG2 and the first cell region CREG1 are bonded to each other by the bonding method.

In some example embodiments, as illustrated in a region 'B2', the third I/O contact plug 5404 may extend in the third direction (e.g., the Z-axis direction), and a diameter of the third I/O contact plug 5404 may become progressively less toward the upper insulating layer 5401. That is, similarly to the channel structure CH, the diameter of the third I/O contact plug 5404 may become progressively less toward the upper insulating layer 5401. For example, the third I/O contact plug 5404 may be formed together with the cell contact plugs 5440 before the second cell region CREG2 and the first cell region CREG1 are bonded to each other.

In some example embodiments, the I/O contact plug may overlap with the third substrate 5410. For example, as illustrated in a region 'C', the second I/O contact plug 5403 may at least partially penetrate the interlayer insulating layer 5415 of the second cell region CREG2 in the third direction (e.g., the Z-axis direction) and may be electrically connected (e.g., coupled) to the second I/O pad 5405 through the third substrate 5410. In such an example, a connection structure of the second I/O contact plug 5403 and the second I/O pad 5405 may be realized by various methods.

In some example embodiments, as illustrated in a region 'C1', an opening 5408 may be formed to at least partially penetrate the third substrate 5410, and the second I/O contact plug 5403 may be connected (e.g., coupled) directly to the second I/O pad 5405 through the opening 5408 formed in the third substrate 5410. In such an example, as illustrated in the region 'C1', a diameter of the second I/O contact plug 5403 may become progressively greater toward the second I/O pad 5405. However, example embodiments are not limited thereto, and in some example embodiments, the diameter of the second I/O contact plug 5403 may become progressively less toward the second I/O pad 5405.

In some example embodiments, as illustrated in a region 'C2', the opening 5408 penetrating the third substrate 5410 may be formed, and a contact 5407 may be formed in the opening 5408. An end of the contact 5407 may be connected to the second I/O pad 5405, and another end of the contact 5407 may be connected to the second I/O contact plug 5403. Thus, the second I/O contact plug 5403 may be electrically connected (e.g., coupled) to the second I/O pad 5405 through the contact 5407 in the opening 5408. In such an example, as illustrated in the region 'C2', a diameter of the contact 5407 may become progressively greater toward the second I/O pad 5405, and a diameter of the second I/O contact plug 5403 may become progressively less toward the second I/O pad 5405. For example, the second I/O contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some example embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively or additionally, the stopper 5409 may be a metal line formed in the same layer as at least one of the wordlines 5430. The second I/O contact plug 5403 may be electrically connected (e.g., coupled) to the second I/O pad 5405 through the contact 5407 and the stopper 5409.

Similarly to the second and third I/O contact plugs 5403 and 5404 of the second cell region CREG2, a diameter of each of the second and third I/O contact plugs 5303 and 5304 of the first cell region CREG1 may become progressively less toward the lower metal pattern 5371*e* and/or may become progressively greater toward the lower metal pattern 5371*c*.

In some example embodiments, a slit 5411 may be formed in the third substrate 5410. For example, the slit 5411 may be formed at a certain position of the external pad bonding region PA. As another example, as illustrated in a region 'D', the slit 5411 may be located between the second I/O pad 5405 and the cell contact plugs 5440 when viewed in a plan view. Alternatively or additionally, the second I/O pad 5405 may be located between the slit 5411 and the cell contact plugs 5440 when viewed in a plan view.

In some example embodiments, as illustrated in a region 'D1', the slit 5411 may be formed to at least partially penetrate the third substrate 5410. For example, the slit 5411 may be used to prevent the third substrate 5410 from being finely cracked when the opening 5408 is formed. However, example embodiments are not limited thereto, and in some example embodiments, the slit 5411 may be formed to have a depth ranging from about 60% to about 70% of a thickness of the third substrate 5410.

In some example embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In such an example, the conductive material 5412 may be connected to an external ground line.

In some example embodiments, as illustrated in a region 'D3', an insulating material 5413 may be formed in the slit 5411. For example, the insulating material 5413 may be used to electrically isolate the second I/O pad 5405 and the second I/O contact plug 5403 disposed in the external pad bonding region PA from the wordline bonding region WLBA. Since the insulating material 5413 is formed in the slit 5411, it may be possible to prevent a voltage provided through the second I/O pad 5405 from affecting a metal layer disposed on the third substrate 5410 in the wordline bonding region WLBA.

In some example embodiments, the first to third I/O pads 5205 to 5406 may be selectively formed. For example, the memory device 5000 may be realized to include only the first I/O pad 5205 disposed on the first substrate 5210, to include only the second I/O pad 5405 disposed on the third substrate 5410, or to include only the third I/O pad 5406 disposed on the upper insulating layer 5401.

In some example embodiments, at least one of the second substrate 5310 of the first cell region CREG1 and the third substrate 5410 of the second cell region CREG2 may be used as a sacrificial substrate and may be completely or partially removed before and/or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Similarly, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

The memory device 5000 may be a nonvolatile memory device, according to example embodiments, and may perform the method of programming data according to example embodiments.

The example embodiments may be applied to various electronic devices and systems that may include the non-volatile memory devices. For example, the embodiments described herein may be applied to devices and/or systems such as, but not limited to, a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, and the like.

The foregoing is illustrative of example embodiments and is not to be construed as limiting thereof. Although some example embodiments have been described, those skilled in the art may readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming data in a nonvolatile memory device, the method comprising:

setting a state ordering to a first state ordering, the state ordering representing a relationship between a plurality of states and data values of multi-bit data, each memory cell of a plurality of memory cells of the nonvolatile memory device being programmed to have one of the plurality of states;

performing, based on the first state ordering, a program operation on target memory cells of the plurality of memory cells;

swapping the state ordering from the first state ordering to a second state ordering different from the first state ordering;

performing, based on the second state ordering, the program operation on the target memory cells;

re-swapping the state ordering from the second state ordering to the first state ordering; and performing, based on the re-swapped first state ordering, the program operation on the target memory cells.

2. The method of claim 1, wherein the swapping of the state ordering from the first state ordering to the second state ordering comprises:

determining whether the program operation is performed with respect to a first state from among the plurality of states, and changing, based on determining that the program operation is performed with respect to the first state, the state ordering from the first state ordering to the second state ordering.

3. The method of claim 2, wherein, in the first state ordering, the first state corresponds to a first data value, and a second state different from the first state corresponds to a second data value different from the first data value, and wherein, in the second state ordering, the first state corresponds to the second data value, and the second state corresponds to the first data value.

4. The method of claim 3, wherein the plurality of states comprises an erase state and a plurality of program states, and wherein the plurality of program states comprises the first state and the second state.

5. The method of claim 3, wherein, in the first state ordering, a third state different from the first state and the second state corresponds to a third data value different from the first data value and the second data value, and a fourth state different from the first state, the second state, and the third state corresponds to a fourth data value different from the first data value, the second data value, and the third data value, and wherein, in the second state ordering, the third state corresponds to the fourth data value, and the fourth state corresponds to the third data value.

6. The method of claim 2, wherein the re-swapping of the state ordering from the second state ordering to the first state ordering comprises:

determining whether the program operation is performed with respect to a second state from among the plurality of states, the second state being different from the first state, and changing, based on determining that the program operation is performed with respect to the second state, the state ordering from the second state ordering to the first state ordering.

7. The method of claim 1, wherein the program operation comprises a plurality of program loops, wherein the plurality of program loops comprises a first program loop to an N-th program loop, where N is a positive integer greater than or equal to two, wherein the swapping of the state ordering from the first state ordering to the second state ordering is performed during the first program loop, and wherein the re-swapping of the state ordering from the second state ordering to the first state ordering is performed during a K-th program loop subsequent to the first program loop, where K is a positive integer greater than or equal to two and less than or equal to N.

8. The method of claim 7, wherein each of the plurality of program loops comprises a program execution interval during which a program voltage is applied to the target memory cells, and a verification interval during which a program verification voltage is applied to the target memory cells, and wherein the swapping of the state ordering from the first state ordering to the second state ordering is performed during the program execution interval of the first program loop.

9. The method of claim 7, wherein each of the plurality of program loops comprises a program execution interval during which a program voltage is applied to the target memory cells, and a verification interval during which a program verification voltage is applied to the target memory cells, and wherein the re-swapping of the state ordering from the second state ordering to the first state ordering is performed during the verification interval of the K-th program loop.

10. The method of claim 1, further comprising:

setting the state ordering based on state data stored in a plurality of latches of a plurality of page buffers of the nonvolatile memory device.

11. The method of claim 10, further comprising:

determining the first state ordering and the second state ordering.

12. The method of claim 11, wherein the determining of the first state ordering and the second state ordering comprises:

determining the first state ordering and the second state ordering based on at least one of a total number of data transfers in which data is transferred between the plurality of latches during the program operation and a total time required for the program operation.

13. The method of claim 12, wherein the determining of the first state ordering and the second state ordering further comprises:

determining the first state ordering and the second state ordering such that a second total time required for the program operation based on the second state ordering is shorter than a first total time required for the program operation based on the first state ordering.

14. The method of claim 13, wherein the determining of the first state ordering and the second state ordering comprises:

determining the first state ordering and the second state ordering such that the second total time required for the program operation based on the second state ordering is shorter than the first total time required for the program operation based on the first state ordering, when a second total number of data transfers during the program operation based on the second state ordering is greater than a first total number of data transfers during the program operation based on the first state ordering.

15. The method of claim 1, further comprising:

swapping the state ordering from the second state ordering to a third state ordering different from the first state ordering and the second state ordering;

performing, based on the third state ordering, the program operation on the target memory cells;

re-swapping the state ordering from the third state ordering to the second state ordering; and performing, based on the second state ordering, the program operation on the target memory cells.

16. The method of claim 1, wherein each of the plurality of memory cells stores data having two or more bits.

17. A nonvolatile memory device, comprising:

a memory cell array comprising a plurality of memory cells, each memory cell of the plurality of memory cells being programmed to have one of a plurality of states;

a page buffer circuit configured to control the plurality of memory cells, the page buffer circuit comprising a plurality of page buffers configured to set a state ordering based on state data, the state ordering representing a relationship between the plurality of states and data values of multi-bit data; and a control circuit configured to:

set the state ordering to a first state ordering;

perform a program operation on target memory cells based on the first state ordering;

swap the state ordering from the first state ordering to a second state ordering different from the first state ordering;

perform the program operation on the target memory cells based on the second state ordering;

re-swap the state ordering from the second state ordering to the first state ordering; and perform the program operation on the target memory cells based on the re-swapped first state ordering.

18. The nonvolatile memory device of claim 17, wherein each of the plurality of page buffers comprises:

a sense latch configured to store data programmed in a memory cell of the plurality of memory cells coupled to a corresponding bitline;

data latches configured to store the state data corresponding to a corresponding state to be programmed during the program operation;

a cache latch configured to receive program data to be programmed during the program operation, and to transmit the program data to the data latches; and a precharge circuit configured to precharge the corresponding bitline during the program operation.

19. The nonvolatile memory device of claim 18, wherein the control circuit is further configured to swap the state ordering by changing at least a portion of the state data in the data latches.

20. A method of programming data in a nonvolatile memory device, the method comprising:

setting a state ordering to a first state ordering, the state ordering representing a relationship between a plurality of states and data values of multi-bit data, each memory cell of a plurality of memory cells of the nonvolatile memory device being programmed to have one of the plurality of states;

performing, based on the first state ordering, a program operation on target memory cells of the plurality of memory cells;

swapping, based on the program operation being performed with respect to a first state from among the plurality of states, the state ordering from the first state ordering to a second state ordering different from the first state ordering;

performing, based on the second state ordering, the program operation on the target memory cells;

re-swapping, based on the program operation being performed with respect to a second state from among the plurality of states that is different from the first state, the state ordering from the second state ordering to the first state ordering; and performing, based on the re-swapped first state ordering, the program operation on the target memory cells, wherein, in the first state ordering, the first state corresponds to a first data value, and the second state corresponds to a second data value different from the first data value, wherein, in the second state ordering, the first state corresponds to the second data value, and the second state corresponds to the first data value, wherein the program operation comprises a plurality of program loops, wherein the plurality of program loops comprises a first program loop to an N-th program loop, where N is a positive integer greater than or equal to two, wherein the swapping of the state ordering from the first state ordering to the second state ordering is performed during the first program loop, wherein the re-swapping of the state ordering from the second state ordering to the first state ordering is performed during a K-th program loop subsequent to the first program loop, where K is a positive integer greater than or equal to two and less than or equal to N, and wherein the first state ordering and the second state ordering are determined such that a second total time required for the program operation based on the second state ordering is shorter than a first total time required for the program operation based on the first state ordering.

* * * * *